United States Patent [19]

Neudeck et al.

[11] Patent Number: 5,422,299
[45] Date of Patent: Jun. 6, 1995

[54] METHOD OF FORMING SINGLE CRYSTALLINE ELECTRICAL ISOLATED WELLS

[75] Inventors: Gerold W. Neudeck, West Lafayette; Stephen J. Duey, Noblesville, both of Ind.

[73] Assignee: Purdue Research Foundation, West Lafayette, Ind.

[21] Appl. No.: 802

[22] Filed: Jan. 4, 1993

Related U.S. Application Data

[63] Continuation of Ser. No. 754,185, Aug. 27, 1991, abandoned, which is a continuation of Ser. No. 405,770, Sep. 11, 1989, abandoned.

[51] Int. Cl.⁶ .................................. H01L 21/302
[52] U.S. Cl. .................................. 437/63; 437/74; 437/78; 437/89; 437/90; 437/956; 257/565
[58] Field of Search .................... 437/74, 89, 90, 31, 437/78, 956, 62, 63; 156/647; 257/565

[56] References Cited

U.S. PATENT DOCUMENTS

| | | | |
|---|---|---|---|
| 4,506,435 | 3/1985 | Pliskin et al. | 437/67 |
| 5,034,342 | 7/1991 | Sidner et al. | 437/78 |

FOREIGN PATENT DOCUMENTS

| | | | |
|---|---|---|---|
| 0043385 | 4/1977 | Japan | 437/62 |
| 0154747 | 12/1980 | Japan | 437/78 |
| 0162443 | 10/1982 | Japan | 437/89 |
| 0197739 | 11/1983 | Japan | 437/90 |
| 0124837 | 7/1985 | Japan | 437/78 |
| 0164333 | 8/1985 | Japan | 437/90 |
| 0233837 | 11/1985 | Japan | 437/90 |
| 0254745 | 12/1985 | Japan | 437/90 |
| 0184845 | 8/1986 | Japan | 437/78 |
| 0084509 | 4/1987 | Japan | 437/78 |
| 0202033 | 8/1988 | Japan | 437/78 |

*Primary Examiner*—Olik Chaudhuri
*Assistant Examiner*—Long Pham
*Attorney, Agent, or Firm*—Barnes & Thornburg

[57] ABSTRACT

A quasi-dielectrically isolated (QDI) bipolar structure using epitaxial lateral overgrowth (ELO) uses a combination of dielectric isolation (DI) and junction isolation (JI), providing better isolation properties than JI, while providing better heat dissipation than DI. ELO silicon is grown out of a deep basin with oxide sidewalls for lateral dielectric isolation. The ELO silicon is grown at a low temperature and pressure in an RF heated pancake-type reactor. Fabricated transistors have gains, ideality factors, and leakage currents comparable to bulk devices. A main application for QDI is in power integrated circuits (PICs) where isolation of high power devices and low power logic is necessary.

16 Claims, 22 Drawing Sheets

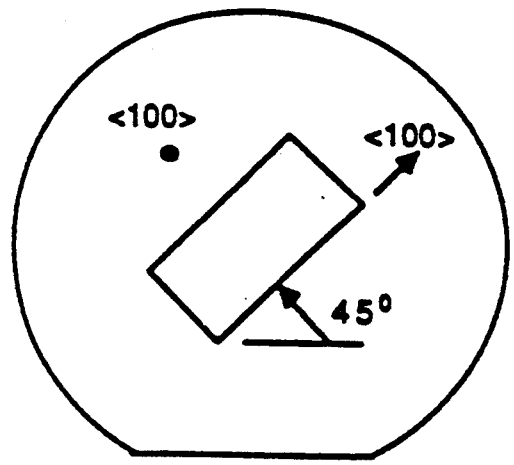
FIG. 27
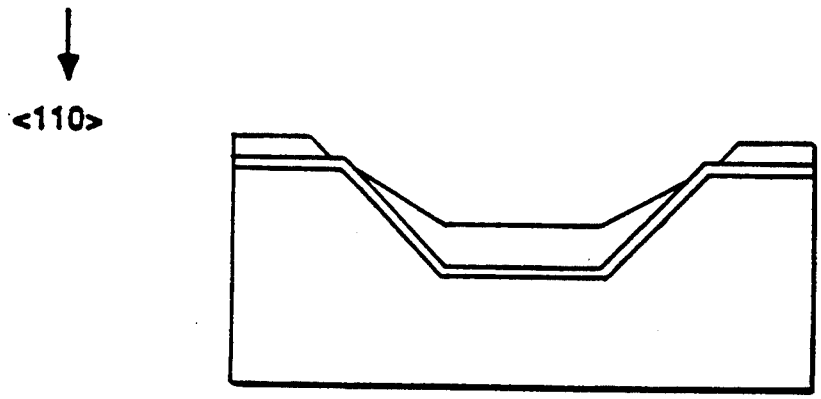
FIG. 28
FIG. 31
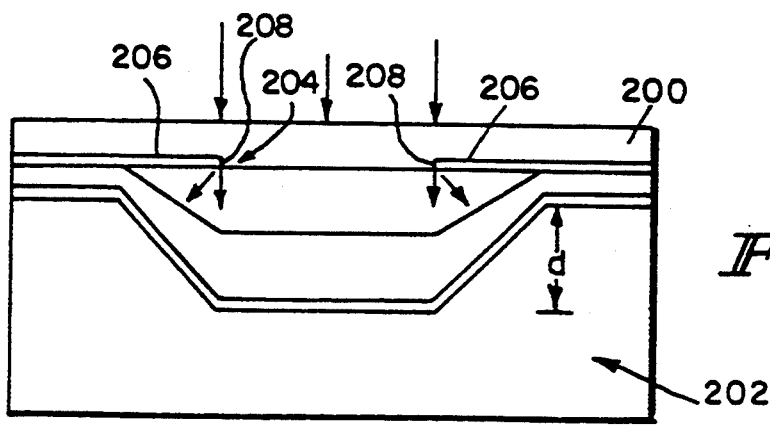
FIG. 33

METHOD OF FORMING SINGLE CRYSTALLINE ELECTRICAL ISOLATED WELLS

This is a Continuation of application Ser. No. 07/754,185, filed Aug. 27, 1991, now abandoned which is a Continuation of application Ser. No. 07/405,770, filed Sep. 11, 1989, now abandoned.

BACKGROUND OF THE INVENTION

Power devices and power integrated circuits (PICs) have a broad range of applications ranging from automotive electronics and avionics to industrial power control. The primary advantage of PICs is the control of power systems at a lower cost. The cost savings from PICs result from package size reduction, elimination of discrete components, and reduced interconnect requirements. A second advantage of PICs is microprocessor compatibility. By integrating power and logic, PICs can become high voltage or high current input/output (I/O) circuits for the microprocessor.

Before power and logic devices can be integrated, a suitable isolation technology must be chosen to separate the high power devices electrically from the lower power logic. Although many isolation techniques exist, they fit generally into two basic categories: junction isolation and dielectric isolation.

Junction isolation (JI) is accomplished, in a standard bipolar process, by using deep P diffusions in the N-type epitaxial layer for lateral isolation as illustrated in FIG. 1. The lateral isolations are reverse biased by coupling them to the lowest potential in the circuit. JI thus implements reverse biased PN junctions to achieve isolation.

However, certain problems attend implementation of JI technology. As vertical devices are required to handle higher voltages, the epitaxial layer must become thicker to handle larger depletion regions. As the epitaxial layer increases, isolation diffusions must become deeper and wider, due to outdiffusion, making them more difficult to make while reducing circuit density.

Another drawback to JI is the increased leakage current at elevated temperatures, leading to device crosstalk and the potential of forming PNPN latchup circuits. A PNPN latchup circuit is illustrated in FIG. 2. The latchup circuit consists of two parasitic transistors, a PNP transistor $T_1$ and an NPN transistor $T_2$, with an effective resistance between the emitter and base of each transistor. The PNPN structure latches up when both transistors enter the active region and the product of the transistors' gains is greater than one.

The transistors can enter the active region if the isolation junction becomes forward biased and the resistors R1 and R2 are large enough to maintain the bias. The bias can occur due to stray currents in the epitaxial layer, voltage spikes in the isolation diffusion, improper sequencing of voltage supplies or displacement currents from rapidly changing node voltages. The resistances R1 and R2 are determined primarily by the doping of the epitaxial layer. As the doping of the epitaxial layer is increased, the resistance of the layer decreases.

When latchup conditions occur, the circuit will be able to sustain a current. When T1 and T2 turn on, T2 draws current from the base of T1, thus increasing the current flow through T1. The increase in T1 current further biases T2, thus increasing the current through T2. This regenerative feedback continues until the circuit destroys itself or is limited by circuit resistance. To remove the condition, power must be removed from the circuit.

Dielectric isolation (DI) is achieved by separating devices with a dielectric material, such as silicon dioxide ($SiO_2$). The separation of devices from each other and the substrate is typically done with conventional DI, local oxidation isolation (LOCOS), trench isolation, or some form of silicon-on-insulator (SOI) technology.

Conventional DI employs single crystal silicon islands on a polysilicon substrate. An outline of the fabrication of DI structures is illustrated in FIGS. 3a–d. Grooves 10 are etched in the substrate 18, followed by oxidation 12, followed by deposition of polysilicon 14. In the completed device, the polysilicon will become the substrate, and therefore the polysilicon must be made very thick, approximately 200 $\mu$m thick. An implant step 16 can be added prior to oxidation and deposition to provide a buried layer in the final structure. After the polysilicon 14 is deposited, the silicon surface 18 is lapped and polished until the $SiO_2$ isolation is exposed. Processing of conventional devices 22 and circuits in the islands 20 thus formed begins at this point.

Some advantages of conventional DI processing are: complete isolation; reduced substrate capacitance; improved bipolar circuit performance in high radiation environments; reduced leakage currents into the substrate; and the established nature of the DI process, which has matured over a long period of time.

Some disadvantages of conventional DI processing are: higher manufacturing costs and lower yields; poor thermal conductivity through the oxide into the polysilicon substrate, since the thermal conductivities of $SiO_2$ and polysilicon are much lower than the thermal conductivity of single crystal silicon; the incidence of defects in the silicon island caused by stress induced during polysilicon growth; bowing of the wafer, also caused by polysilicon growth; mechanical polishing tolerance-dependent control of tub thickness; and, limitation of the DI process to 3 and 4 inch wafers.

A variation on the conventional DI process is the Vertical Lateral Composite Structure (VLCS), illustrated in FIGS. 4a–e. Processing of the VLCS structure is identical to the DI process (and so the same reference numerals are used to indicate the various structures), except that windows 24 are etched prior to polysilicon 14 deposition. Upon deposition, the polysilicon 14 crystallizes into single crystal silicon 26 over the exposed silicon island 20. The wafer is then ground and polished as in DI, leaving single crystal islands in contact with an essentially single crystal substrate. Processing of conventional devices and circuits is carried out in the single crystal islands.

Advantages of VLCS over the previously discussed form of DI include better heat dissipation through the single crystal silicon 26 and reduced wafer bowing from polysilicon 14 deposition. The main disadvantage of VLCS is process complexity. The fabrication sequence retains the complex DI process with an added photolithography step.

Local oxidation isolation (LOCOS), anotherprocess employing DI, uses locally oxidized regions to isolate devices. A typical LOCOS process sequence is illustrated in FIGS. 5a–c. A thin, stress relief oxide 30 is grown and a thin layer 32 of silicon nitride ($Si_3N_4$) is deposited on the oxide 30. The $Si_3N_4$ 32 and oxide 30 are then patterned. A thick oxide 34 is then grown on the surface, and the $Si_3N_4$ 32 layer is removed. As shown, $Si_3N_4$ 32 masks the underlying silicon 36 from oxidizing. Following the oxidation, $Si_3N_4$ 32 is selectively etched without affecting the $SiO_2$ 34.

Two main advantages of LOCOS are that it provides a nearly planar structure, and that smaller devices are possible since contact can be made to regions bounded by local oxidation without an additional contact mask and alignment step. FIG. 6a illustrates the emitter, base, and collector of a conventional planar process and FIG. 6b the emitter, base and collector of a LOCOS process. LOCOS provides better lateral isolation than JI, while reducing sidewall and lateral parasitic capacitances.

LOCOS has some weaknesses. During the thick oxidation step, local oxidation can penetrate under the $Si_3N_4$ mask, creating the "bird's beak" 40 and "bird's crest" 42 effects illustrated in FIGS. 7a and b, respectively, thereby reducing the available area for device fabrication. Another problem is caused by the difference in coefficients of thermal expansion between $Si_3N_4$ and Si.

Another type of DI is so-called trench isolation. The process flow for trench isolation is illustrated in FIGS. 8a–c. Trenches 44 are formed in the silicon 46 and the trench sidewalls are oxidized 48. The trenches 44 are then filled with polysilicon 50 and etched, making the wafer surface flat to avoid breakage of metallization lines due to step coverage.

Devices 52 are then fabricated between trenches 44, with the trenches 44 providing lateral dielectric isolation. Trench isolation is typically a shallow process designed primarily for high density circuits. However, deep (5–6 μm) trenches have been used to isolate CMOS devices. The deep trenches provide increased circuit density and reduced latch-up susceptibility. The higher circuit density is due to the elimination of the "bird's beak" 40 and "bird's crest" 42 (FIGS. 7a–b) effects seen in LOCOS structures. Although trench isolation provides lateral dielectric isolation, vertical isolation is still JI, and collector-to-substrate capacitance therefore is not significantly reduced.

Silicon-on-insulator (SOI) is another form of DI. Some silicon-on-insulator (SOI) technologies are silicon implanted with oxygen (SIMOX), silicon-on-sapphire (SOS), bonded wafers, oxidation of porous silicon (FIPOS), solid state recrystallization, and epitaxial lateral overgrowth (ELO). SOI technologies reduce leakage currents and eliminate potential PNPN latchup circuits. These technologies are also capable of high voltage operation resulting from the dielectric's ability to block large voltages.

SOI technologies must meet two criteria. First, crystal defects in the film can cause increased leakage current in the circuit, so crystal defects in SOI films must be minimized so that device performance is not degraded. Second, since warpage of the wafer can create defects and cause problems in the lithography process, warpage must be minimized.

The SIMOX process forms a layer of $SiO_2$ under the surface of the silicon. This is accomplished by implanting a large dose 56 of high energy oxygen ions, as illustrated in FIG. 9a. Higher energies increase the depth at which $SiO_2$ is formed, but projected and transverse straggle increase with increasing implant energy. This variation in depth and width creates a larger volume of $SiO_2$, which requires that a larger dose of oxygen ions be implanted. A lower energy and lower dose can be used, but the depth of penetration is reduced. After the oxygen 56 is implanted, the wafer must be annealed (FIG. 9b) to "heal" the implant damage to the surface 58 of the silicon 60 and form $SiO_2$ 62.

This technology improves packing density of circuits, reduces design and fabrication complexity, improves speed and power consumption, and has potential for high voltage applications.

However, SIMOX is currently limited to thin layers 62 of $SiO_2$ and thin layers 60 of single crystal silicon. This limits SIMOX to low voltage MOS and CMOS device applications. Another problem with SIMOX is the high dose 56 of oxygen required to form the oxide. Ion implanters presently in use require on the order of $10^3$ seconds per wafer to implant such a high dose, about $10^{18}$ ions/$cm^2$. The defect density and higher leakage currents resulting from the heavy implant dosage deter from the use of SIMOX for bipolar applications.

Silicon is fabricated on sapphire (SOS) by growing an epitaxial layer 64 of silicon on a sapphire substrate 66, as illustrated in FIG. 10. The basic advantage of SOS technology is increased packing density due to the simplicity of the isolation scheme. Minimum device spacing is determined by linewidth on the mask and mask alignment. Also, the parasitic capacitances of electrodes are reduced, since the substrate capacitance is nearly eliminated. This feature permits devices constructed using SOS technology to operate at higher frequencies than equivalent circuits in bulk silicon.

However, SOS films tend to be inferior electronically and physically to bulk material. SOS tends to have higher defect density and shorter minority carrier lifetimes than bulk silicon. The defects in the Si film 64 are caused by the differences in atomic spacing of the sapphire 66 and Si 64 crystals. As a result, Si films in SOS technology are effectively limited to 1 μm in thickness. Longer lifetimes are desirable in bipolar devices since current flow in bipolar devices depends on minority carriers. The longer the minority carrier lifetime, the lower the recombination, and hence the greater the forward current gain. Therefore, SOS has been primarily a MOS technology, since minority carrier lifetime is not as critical in MOS devices. Furthermore, the sapphire substrate 66 is much more expensive than a silicon substrate.

Another DI technique is the bonded wafer technique. This is a relatively new approach to SOI and consists of bonding two 70, 72 oxidized 74 silicon 76 wafers together. This is done by placing the oxidized wafers 70, 72 in contact with each other and exposing them to a high temperature oxidizing ambient atmosphere. A bonding oxide forms between them, and one 72 of the wafers is ground and polished to the desired thickness. The process sequence is illustrated in FIGS. 11a–c.

Bonded wafers should provide bulk crystal quality since the isolated layer began as a bulk wafer. Better circuit density than JI is achievable with the addition of the trench isolation process. Isolation oxide thickness is controllable, allowing growth of thick oxide for high voltage applications.

As with conventional DI, the thickness control of the ground and polished wafer is determined by the mechanical tolerances of the machine. This is a problem since over 99% of wafer 72 typically must be removed. A typical tolerance is 11 μm±2 μm across the wafer. Another problem is the bonding of the two wafers 70, 72. If the bond is incomplete or weak, the wafers 70, 72 may not remain bonded throughout subsequent fabrication operations.

Another DI technique is full isolation by porous oxidized silicon (FIPOS). FIPOS takes advantage of an electrochemical reaction forming porous silicon selectively in heavily doped silicon. The original process sequence is illustrated in FIGS. 12a–d. Wafers 80 are placed in hydrofluoric acid (HF) 82 and a current 84 is applied across the heavily doped silicon surface 86 of each wafer 80. This process, called anodization, creates a porous surface 90 on the wafer 80. Once this porous surface 90 is formed, a silicon epitaxy 92 is grown. Islands 94 are then etched in the epitaxy 92, leaving exposed pores 96 filled with silicon between the islands 94. The wafer 80 is oxidized 98, and the porous anodized silicon in the pores 96 oxidizes faster than the epitaxial islands 94, leaving silicon islands 94 on oxide 98.

However, islands 94 of silicon have been observed to fall off the porous oxide surface in subsequent processing steps. This occurs because of the high etch rate of porous oxide compared to the oxide on the islands. The porous oxide etches underneath the islands, essentially disconnecting them from the wafer.

Another type of DI is solid state recrystallization. This process involves recrystallizing a previously deposited layer 100 of silicon on an oxidized 102 wafer 104. The silicon layer 100 is heated to the point at which it will recrystallize, but not melt. The crystal orientation can be controlled by opening a seed window 106 in the oxide 102 to the substrate 104. The deposited silicon 100 will recrystallize in the same orientation as the wafer 104. This process is illustrated in FIGS. 13a–c.

Several sources for heating the silicon layer 100 have been used. These include high powered lasers, electron beams, graphite strip heaters, and arc lamps. These sources heat small zones on the wafer 104, and the source is moved across the wafer 104. This process is also known as zone melt recrystallization (ZMR).

A major problem with this technique is that the temperature differences among the melt zone, substrate, and surrounding film can induce stresses that cause defects in the recrystallized film. High defect densities are, of course, detrimental to device performance.

Another form of DI is epitaxial lateral overgrowth (ELO). ELO is illustrated in FIGS. 14a–c. In ELO, a substrate 110 is oxidized 112, a seed hole 114 is opened, exposing the substrate 110, and silicon 116 is grown epitaxially only on the exposed 114 silicon 110. This is known as selective epitaxial growth (SEG). Once the SEG reaches the surface 118 of the oxide 112 (FIG. 14b), SEG continues to grow vertically, but also starts to grow laterally (FIG. 14c). This lateral growth gives rise to the name ELO.

By combining ELO and trench isolation, SOI films can be formed and devices fabricated. A typical process sequence is illustrated in FIGS. 15a–d. A wafer 120 is oxidized 122, then patterned, and then seed windows 124 are etched around oxide islands 126. Silicon 128 is then selectively grown epitaxially, vertically and laterally, and the lateral overgrowths merge together over the oxide (FIG. 15b). The silicon 128 epitaxy is then planarized, trench 130 isolations are formed and circuits 132 are fabricated in the SOI islands.

This process has the advantages of SOI, and is much less expensive than SOS. However, the process is complex, involving planarization and trench isolation.

SUMMARY OF THE INVENTION

According to the present invention a new method for isolating power transistors, using epitaxial lateral overgrowth (ELO), comprises the steps of creating a U-shaped groove in a silicon substrate, followed by oxidation. An opening for ELO (a seed window) is formed in the bottom of the groove, and ELO is grown from the seed window, filling the groove. The ELO is isolated laterally, and partially isolated vertically, by the oxide. The seed window acts as a reverse biased diode, completing the isolation of the ELO from the substrate. Devices can then be fabricated in the ELO. This method has applications for isolation of power devices for integration with low power logic circuits.

BRIEF DESCRIPTION OF THE DRAWINGS

The invention may best be understood by referring to the following detailed description and accompanying drawings which illustrate the invention. In the drawings:

FIG. 27 illustrates a top plan view of a mask layout containing transistors T, test patterns X, spreading resistance profile (SRP) squares S, and alignment dies A;

FIG. 28 illustrates a top plan view of a silicon wafer showing basin orientation on the wafer;

FIG. 31 illustrates a cross section of a portion of a wafer including a basin showing resist breakaway at the basin edges;

FIG. 33 illustrates a cross section of a portion of a wafer including a basin and overlying mask during a seed hole lithography step;

DETAILED DESCRIPTION OF AN ILLUSTRATIVE EMBODIMENT

Figure 1:
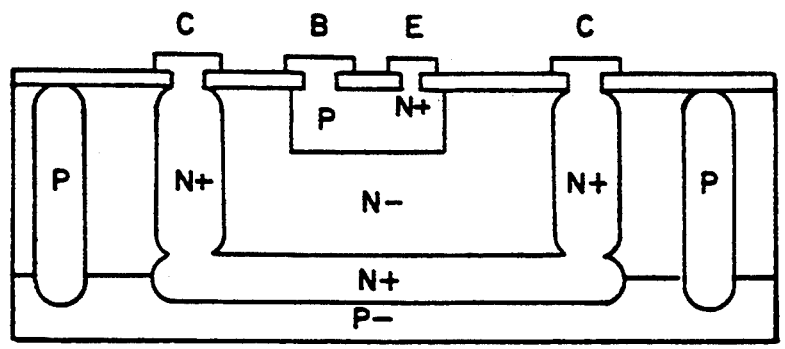
FIG. 1 illustrates a cross section through a vertical high voltage transistor employing JI.
Figure 2:
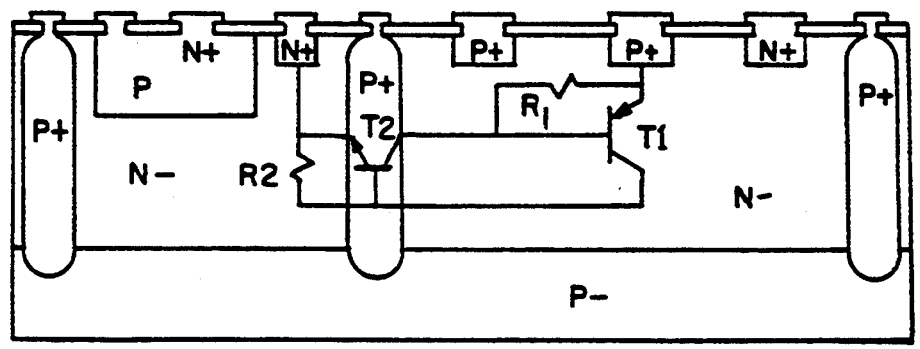
FIG. 2 illustrates a schematic diagram of a latch up circuit superimposed on a cross section through a JI circuit.
Figure 3A:
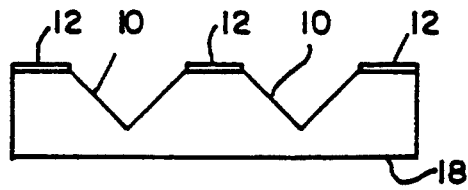
FIGS. 3a–d illustrate process steps in the construction of conventional DI circuits.
Figure 3B:
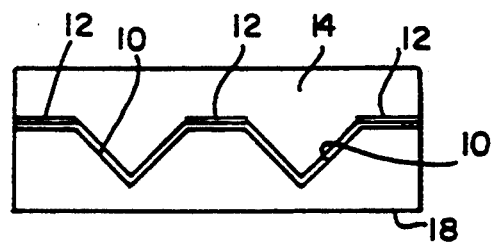
Figure 3C:
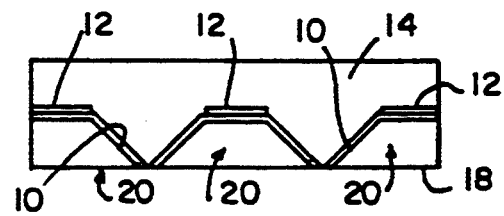
Figure 3D:
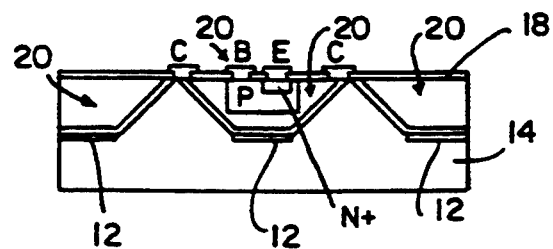
Figure 4A:
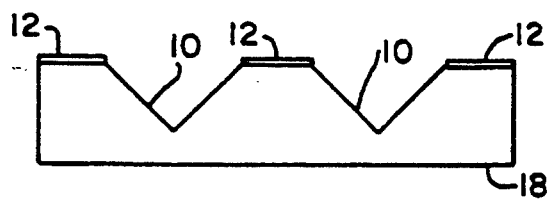
FIGS. 4a–e illustrate process steps in the construction of conventional VLCS.
Figure 4B:
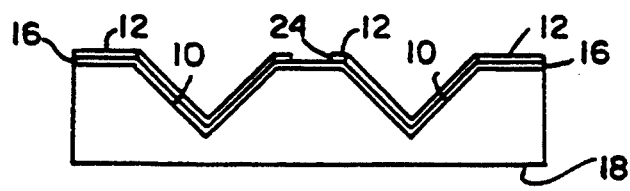
Figure 4C:
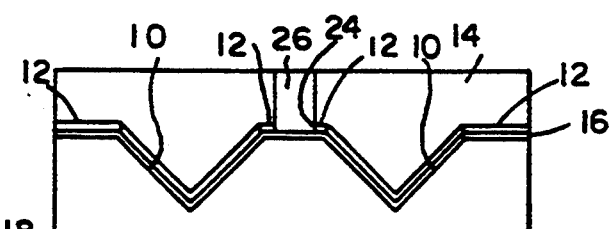
Figure 4D:
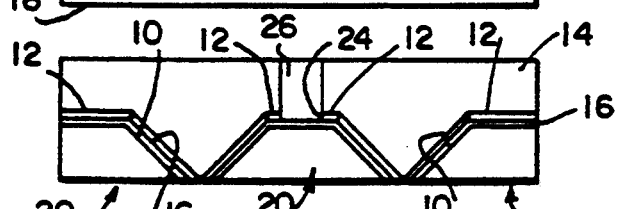
Figure 4E:
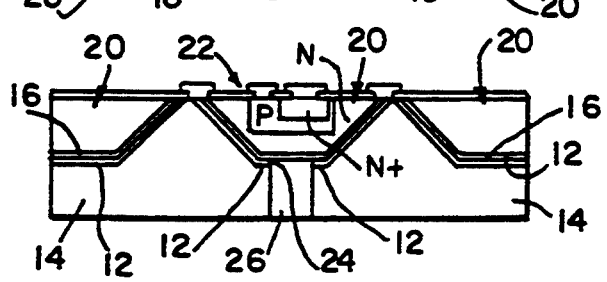
Figure 5A:
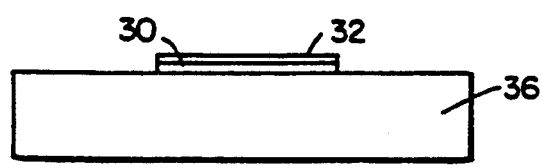
FIGS. 5a–c illustrate process steps in the construction of conventional LOCOS structures.
Figure 5B:
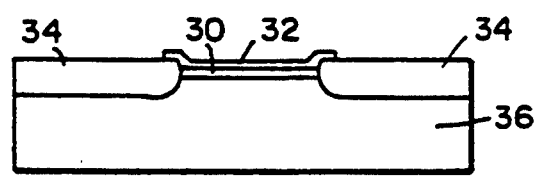
Figure 5C:
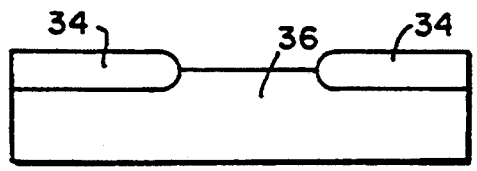
Figure 6A:
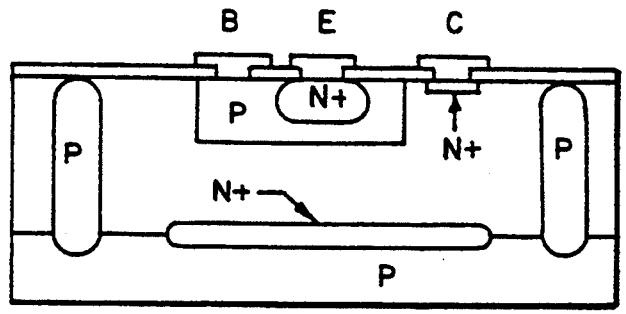
FIGS. 6a–b illustrate, respectively, cross sections through conventional and LOCOS bipolar junction transistors.
Figure 6B:
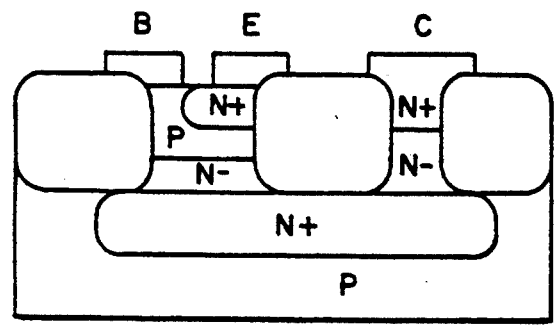
Figure 7A:
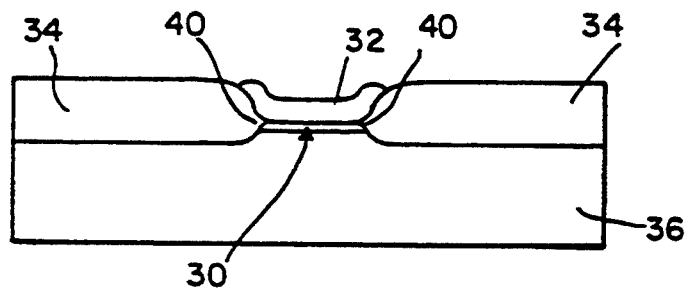
FIGS. 7a–b illustrate, respectively, bird's beak and bird's crest oxide encroachment structures.
Figure 7B:
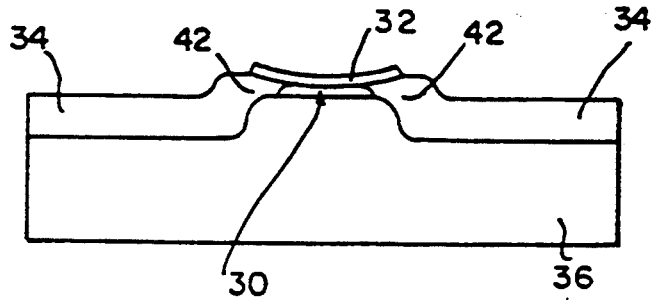
Figure 8A:
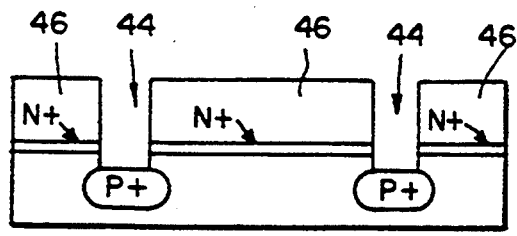
FIGS. 8a–c illustrate process steps in the constructions of trench isolation structures.
Figure 8B:
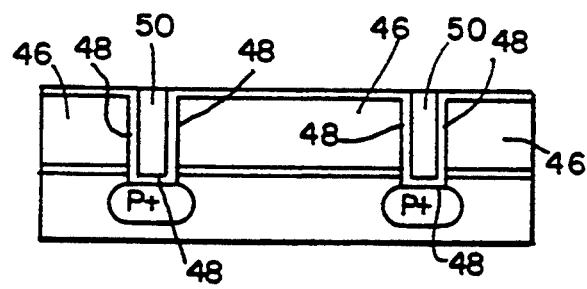
Figure 8C:
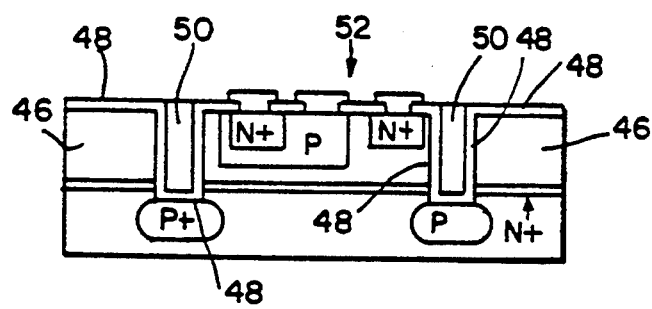
Figure 9A:
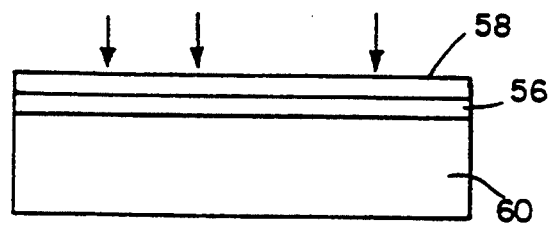
FIGS. 9a–b illustrate process steps in the SIMOX fabrication sequence.
Figure 9B:
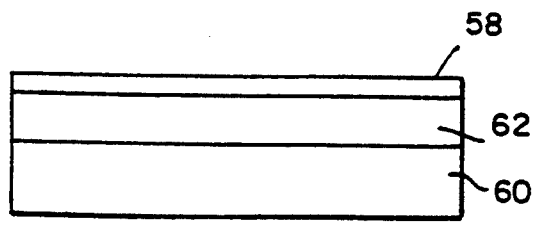
Figure 10:
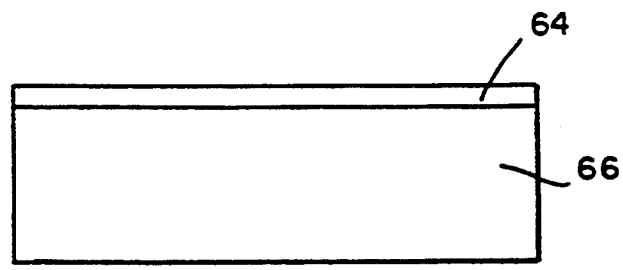
FIG. 10 illustrates a cross section through a silicon epitaxial layer grown on a sapphire substrate.
Figure 11A:
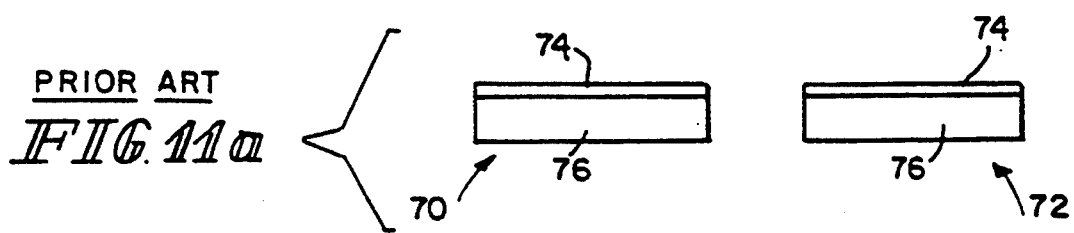
FIGS. 11a–c illustrate process steps in the bonded wafer process sequence.
Figure 11B:
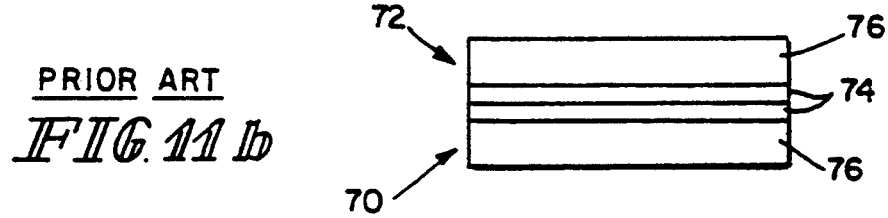
Figure 11C:
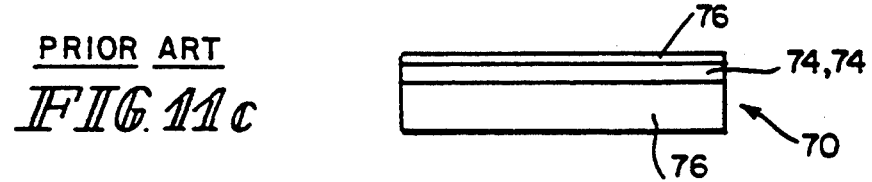
Figure 12A:
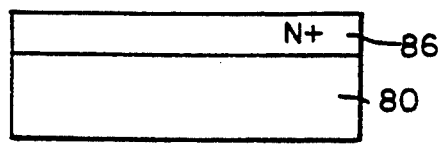
FIGS. 12a–d illustrate process steps in the FIPOS process sequence.
Figure 12B:
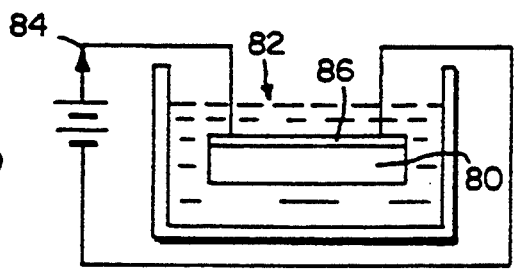
Figure 12C:
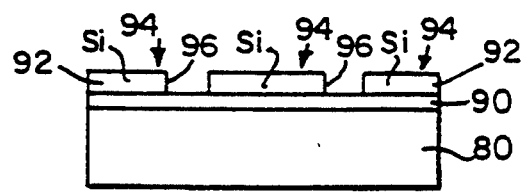
Figure 12D:
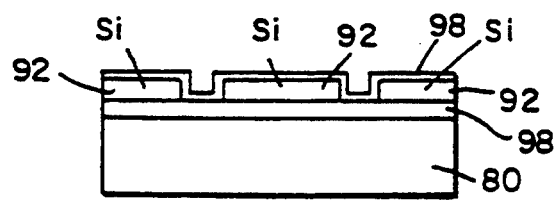
Figure 13A:
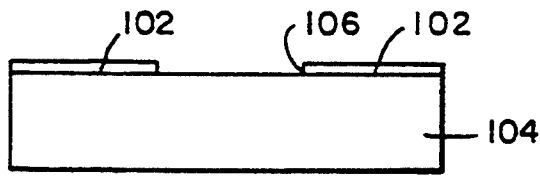
FIGS. 13a–c illustrate process steps in the solid state recrystallization process.
Figure 13B:
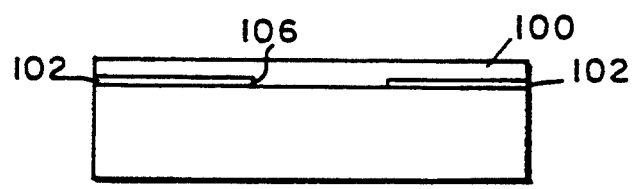
Figure 13C:
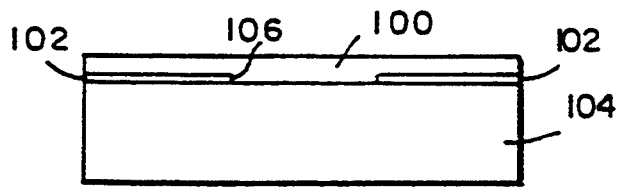
Figure 14A:
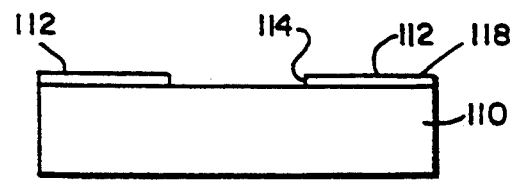
FIGS. 14a–c illustrate process steps in the ELO process.
Figure 14B:
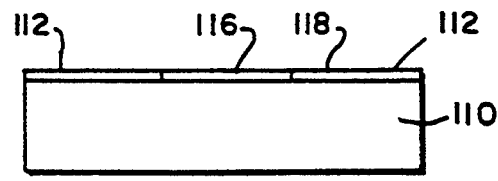
Figure 14C:
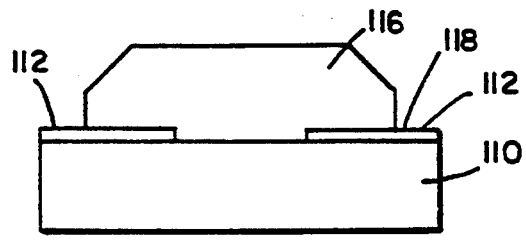
Figure 15A:
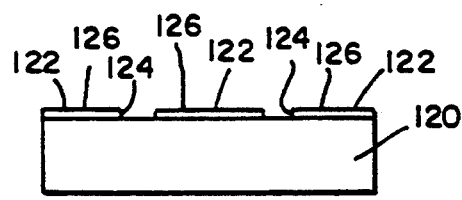
FIGS. 15a–d illustrate process steps in the fabrication of SOI islands using ELO and trench isolation.
Figure 15B:
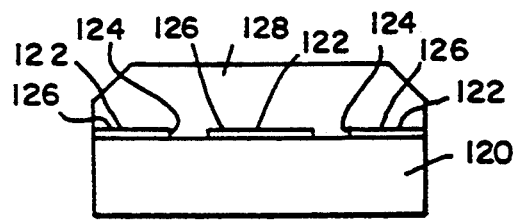
Figure 15C:
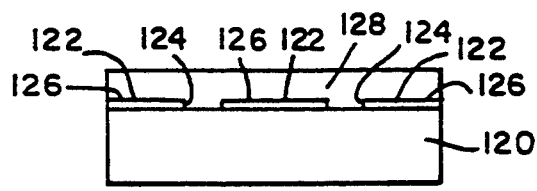
Figure 15D:
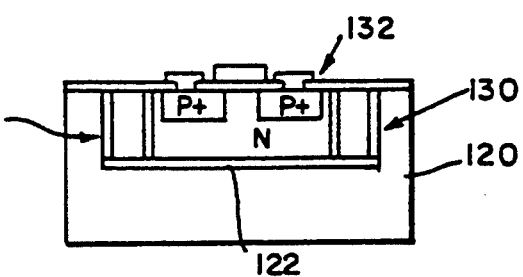
Figure 16A:
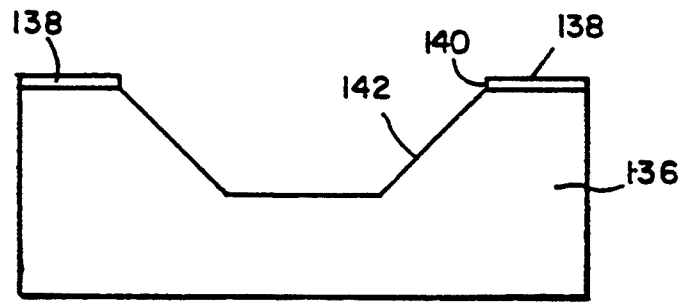
FIGS. 16a–c illustrate process steps in the ELO-QDI process sequence of the present invention.
Figure 16B:
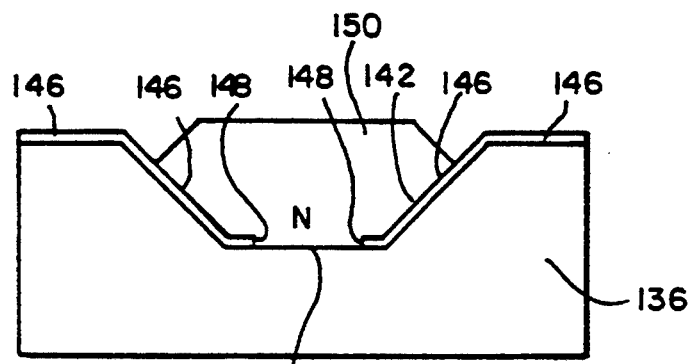
Figure 16C:
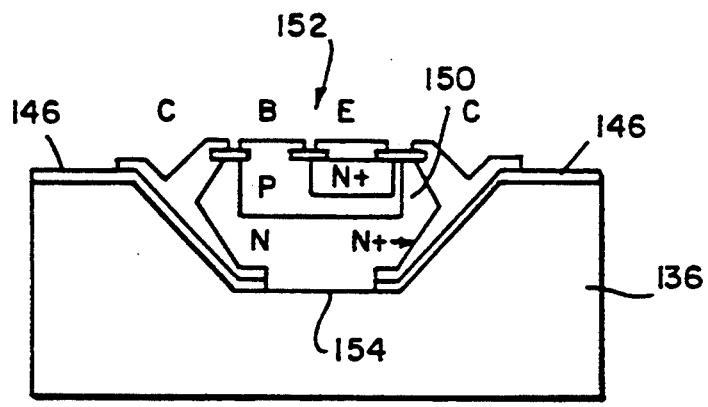

Quasi-dielectric isolation (QDI) is achieved using epitaxial lateral overgrowth (ELO). This isolation technique, hereinafter sometimes referred to as ELO-QDI, combines ELO, conventional DI, and JI. An ELO-QDI process sequence is illustrated in FIGS. 16a–c. According to the process, a substrate 136 is oxidized 138, windows 140 are opened in the oxide 138, and tubs 142 are etched in the silicon 136. The oxide 138 is then etched away, the substrate 136 is oxidized 146 again, and a seed window 148 is opened for ELO. ELO 150 is grown in the basin 142 thus formed, and devices 152 are made in the ELO island 150 grown by the process.

This scheme isolates the device 152 laterally with oxide 146. Most of the vertical isolation is achieved by the oxide 146, but there is some vertical isolation by JI 154. However, the JI 154 has a reduced area compared to conventional JI, thus reducing the substrate 136 capacitance. The structure has several advantages over conventional DI. First, since single crystal silicon dissipates heat faster than $SiO_2$ and the polysilicon substrate, ELO-QDI has better heat dissipation because the device island 150 is connected 154 directly to the substrate 136. Second, the original substrate 136 is intact for implementing logic or other circuits. Third, since DI introduces defects in the Si islands 150 during grinding and polishing, and defects caused by warpage of the wafer 136 from depositing polysilicon are eliminated, ELO-QDI has the potential to provide better island 150 crystal quality. Fourth, the ELO 150 growth is carried out at low temperature and pressure, allowing more flexibility for integrating ELO-QDI structures into other processes.

There are some disadvantages of the ELO-QDI structure. A relatively long ELO 150 growth cycle is required to fill the basin 142. Also, the quality of the etched basins 142 must be extremely good, since any defects in the basins 142 will propagate into the ELO 150 during the ELO 150 growth.

The computer programs available for use in developing this new process included SUPREM II and SUPREM III (process simulation programs available from Stanford University) and BRUTUS (a graphics program developed at Purdue University for designing masks). The hardware available included: a Cambridge EBMF 2.5 electron beam lithography machine for making the masks; a Kasper mask aligner; an AIM 210 ion implant machine; a Perkin-Elmer model 2400 sputter deposition system; a GEMINI I silicon epitaxial reactor; oxidation and contact anneal furnaces; and a Tempress Model 602 dicing saw.

The ELO-QDI fabrication required the design of transistors, test structures, and alignment marks. This required the design and layout of two different dies and an alignment pattern. The first die (FIG. 20) contained various transistor designs (FIGS. 17–19, 40–42) while the second die (FIG. 26) contained the test structures (FIGS. 21–25) for evaluating the process parameters used.

Figure 20:
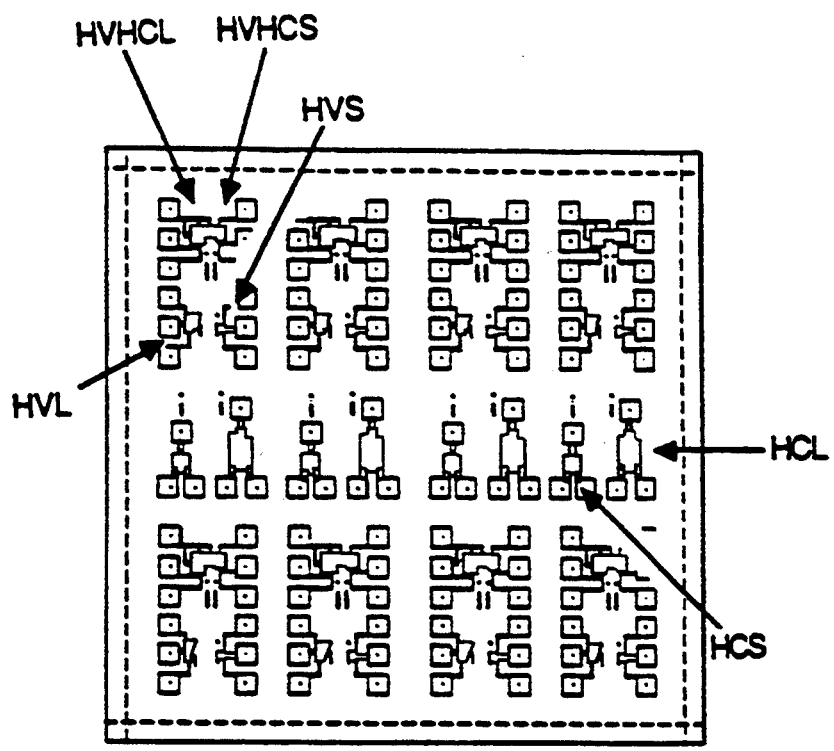
FIG. 20 illustrates a top plan view of a transistor die layout with both large and small geometry HV, HVHC and HC transistors.

The transistor die (FIG. 20) contained three different transistor types: high voltage (HV); high voltage-higher current (HVHC); and high current (HC). Each transistor type was designed in minimum (S) and maximum (L) geometry configurations, giving a total of six different transistors (HCS, HCL, HVS, HVL, HVHCS, HVHCL) in the die (FIG. 20). The maximum geometry (L) devices were designed for ease of fabrication and to avoid potential problems of ELO facet formation. The minimum geometry (S) transistors were implemented in an attempt to establish a minimum size limit to the ELO-QDI structure.

Figure 17:
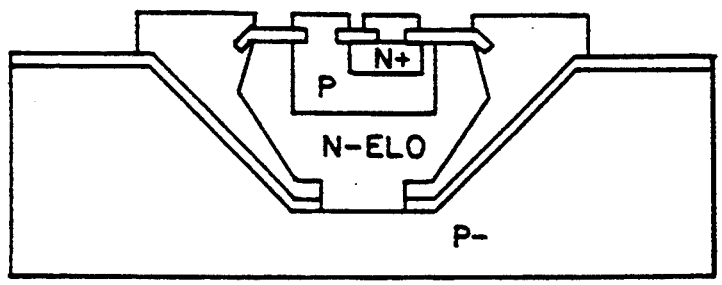
FIG. 17 illustrates a cross section through an HV ELO-QDI bipolar junction transistor.

The HV designs, illustrated in FIG. 17, were of the originally proposed ELO-QDI structure. They had small emitter areas and lightly doped collector regions for high voltage, low current operation. The emitter areas of the minimum and maximum geometries were 20 $\mu$m × 20 $\mu$m and 50 $\mu$m × 50 $\mu$m, respectively.

Figure 18:
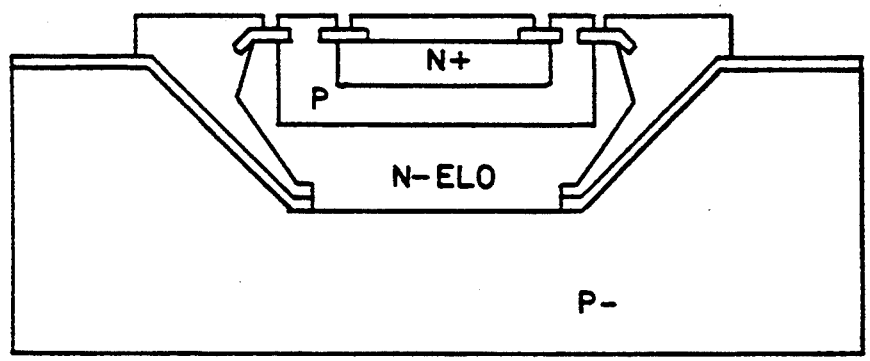
FIG. 18 illustrates a cross section through an HVHC ELO-QDI bipolar junction transistor.

The HVHC designs, illustrated in FIG. 18, were also of the originally proposed ELO-QDI structure. These designs differed from the HV designs in the size of the emitter and overall dimensions. The emitter areas were three times the size of the HV emitter, with dimensions of 20 $\mu$m × 60 $\mu$m and 50 $\mu$m × 150 $\mu$m for the minimum and maximum geometries, respectively.

Figure 19:
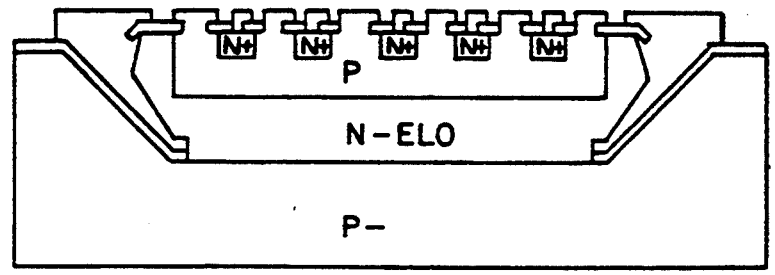
FIG. 19 illustrates a cross section through an HC ELO-QDI bipolar junction transistor.

The HC designs, illustrated in FIG. 19, were multiple emitter designs. The HC designs had five emitters, each measuring 20 $\mu$m × 30 $\mu$m and 30 $\mu$m × 50 $\mu$m for the minimum and maximum geometries, respectively. The transistors were placed in a 6 mm × 6 mm die as illustrated in FIG. 20.

The transistors were designed with high voltage operation as a priority. However, several design tradeoffs must always be made in the design of a power transistor. The quality of a transistor is measured by its junction leakage currents ($I_{CEO}$, $I_{EBO}$ and $I_{CBO}$), current gain ($\beta$), Early effect voltage ($V_A$), junction ideality factors ($\eta$), junction breakdown voltages ($V_{BR}$), and punch through voltage ($V_{PT}$).

Junction leakage currents, $I_{EBO}$ and $I_{CBO}$, are dominated by thermally generated carriers in the respective depletion regions and/or by surface leakage. For large area devices, the junction in the bulk of the silicon is though to be the primary component of junction leakage current. The leakage currents are indicative of crystal quality, with large leakage currents indicating high defect densities and/or high levels of metallic impurities. Defects are especially important in the design of bipolar devices. Since current flow depends on minority carriers, crystal defects and metal impurities act as recombination/generation centers for these carriers. Process design can also affect leakage currents. A gettering process for removing metallic contaminants can reduce the leakage currents caused by metal impurities.

The current gain $\beta$ is the ratio of the collector current $I_C$ to the base current $I_B$. High junction leakage currents, low minority carrier lifetimes, high recombination rates in the base, and high current operation all tend to reduce $\beta$. Because current flow is dependent upon minority carriers, any effect causing a reduction in the minority carrier lifetime will reduce the amount of current diffusing and subsequently injected into the collector, thereby reducing the current gain.

The Early effect, also known as base width modulation, is the narrowing of the base width as $V_{CE}$ increases. The base narrows from the depletion regions of both junctions extending into the base. Since the base-emitter junction bias is typically held constant during forward active operation, base width narrowing results primarily from the base-collector depletion region extending into the base region. With a narrower base, the slope of the minority carrier profile increases and the $\beta$ increases. The Early effect voltage, $V_A$, is the point at which the forward active portions of the $I_C$ vs. $V_{CE}$ curves, if projected, would intersect the $V_{CE}$ axis, with this intersection being taken as $V_A$. A large $V_A$ indicates very little base-width modulation and a more constant $\beta$.

At low current levels, the ideality factor $\eta$ is a relative measure of the quality of a junction in the transistor. An $\eta$ of 1.00 indicates that diffusion currents dominate over recombination current, and the material is very good. An $\eta$ of 2.00 indicates recombination current is dominant over diffusion current, and the material has a relatively high density of defects. At high current levels, bulk resistance and device geometry effects begin to dominate, and consequently the effective n increases.

Under reverse bias, breakdown voltage is the voltage at which current increases dramatically. Junction breakdown voltages are determined by the relative doping of both sides of the junction-and surface conditions. The base-collector breakdown voltage must be made high, since most of the voltage drop in the forward active mode is across this reverse biased junction. The high $V_{BR}$ is achieved by lightly doping the collector with respect to the base doping. This in turn requires a longer collector region to absorb the larger depletion region, which extends primarily into the collector.

Punch through occurs when the depletion regions from both junctions meet in the base region. As a result of punch through, the collector and emitter are electrically connected. To prevent punch through, the base doping must be high to keep the depletion regions in the base relatively small. Since the emitter is heavily doped, the collector region must be lightly doped to absorb the majority of the depleted region. Currently, ELO is grown from intrinsic silicon. However, previous work indicates that intrinsically grown ELO has an N-type impurity doping level of $4.5 \times 10^{13}$ to $2.0 \times 10^{14}$ cm$^{-3}$. This doping is a result of impurities in the reacting gases and doping from residual impurities in the reactor. This results in a highly resistive collector which is suitable for high voltage applications, because of the collector's ability to absorb most of the base-collector depletion region. However, this doping level limits the current carrying capacity of the transistor. The current is limited primarily by the ability of the transistor to dissipate heat generated in the collector region.

Figure 25A:
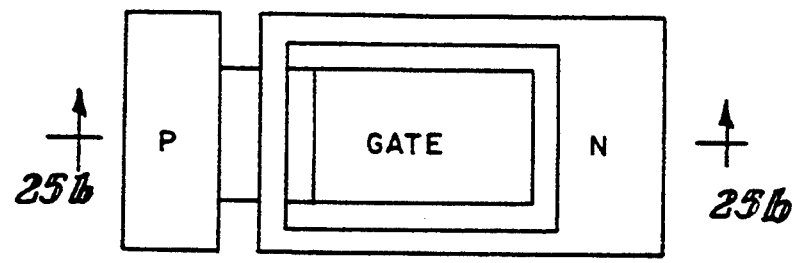
FIGS. 25a–b illustrate, respectively, a top plan view of a gate controlled diode and a cross section through a gate controlled diode.
Figure 25B:
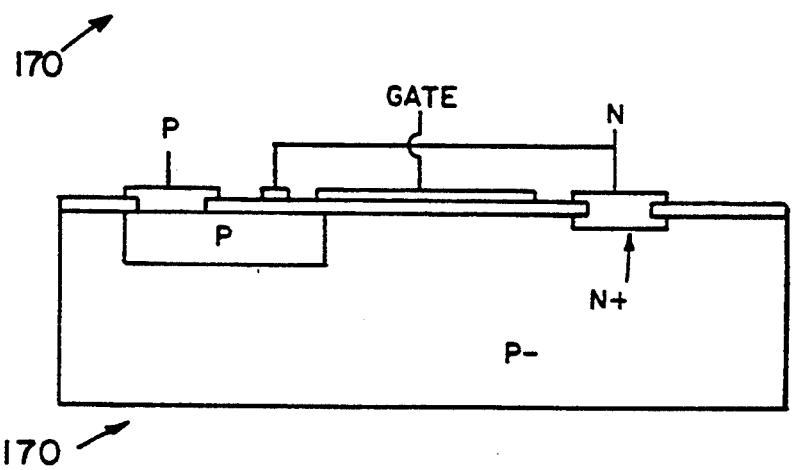
Figure 26:
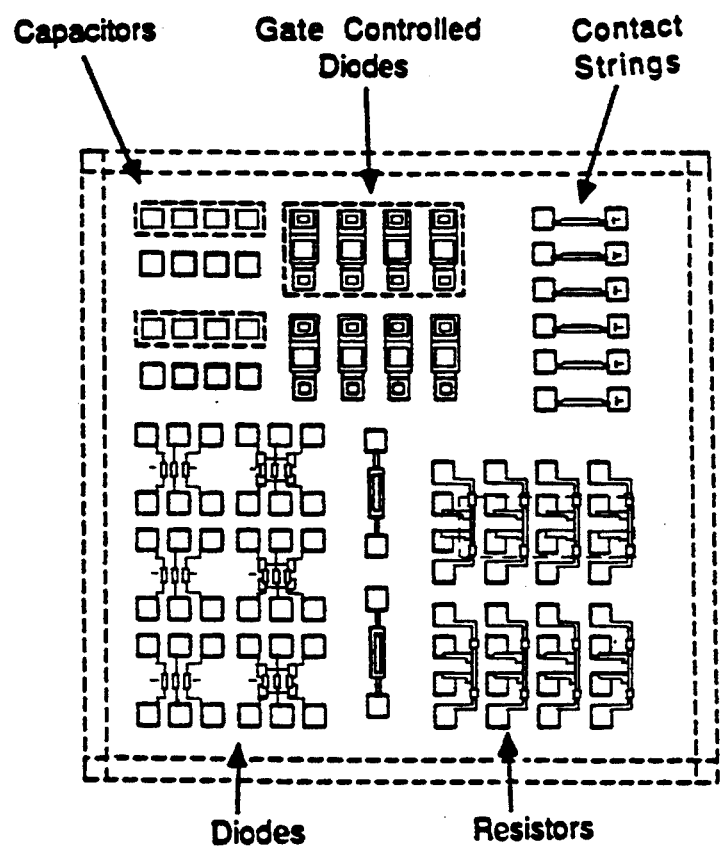
FIG. 26 illustrates a top plan view of a test die containing, clockwise from the upper left corner, capacitors, gate controlled diodes, contact strings, resistors, and diodes.

The test die of FIG. 26 contained several devices for evaluating the process parameters. The devices fabricated were capacitors 160 (FIGS. 21 and 26), resistors 162 (FIGS. 22 and 26), contact strings 164 (FIGS. 23 and 26), diodes 166, 168 (FIGS. 24a–b and 26), and gate controlled diodes 170 (FIGS. 25a–b and 26). These devices, except for the contact strings 164, were implemented in both the substrate and in ELO. This was done to provide a direct comparison of device performance in both regions.

Figure 21:
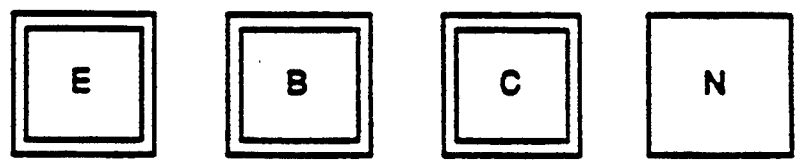
FIG. 21 illustrates a top plan view of 200 $\mu$m×200 $\mu$m test capacitors located over, from left to right, an emitter diffusion, a base diffusion, a collector diffusion and bulk ELO material.

The capacitors 160, illustrated in FIG. 21 were 200 $\mu$m × 200 $\mu$m. The capacitors were located over base (B), emitter (E), and collector (C) diffusions as well as field oxide (N). Capacitors 160 provided information as to the oxide thickness, doping level under the oxide, and the quality of the oxide.

Figure 22:
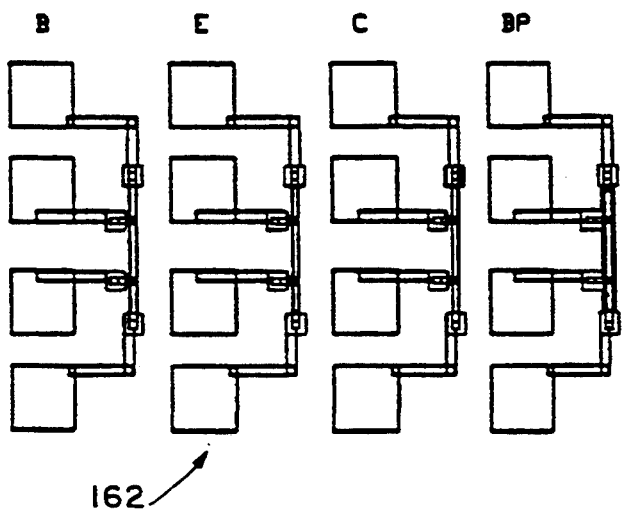
FIG. 22 illustrates a top plan views of, from left to right, base diffused test resistors, emitter diffused test resistors, collector diffused test resistors, and base pinch resistors.

Resistors 162, illustrated in FIG. 22, included collector (C), base (B), and emitter (E) diffusion resistors, as well as a base pinch resistor (BP). Each of the diffused resistors 162 yielded sheet resistance information, and provided a correlation to the expected impurity concentrations of each region. The base pinch (BP) resistors 162, provided information on the base doping level underneath the emitter diffusion. The base region under the emitter provided a more accurate value of the actual base resistance, seen by the transistor, than the base diffusion resistor (162B).

Figure 23:
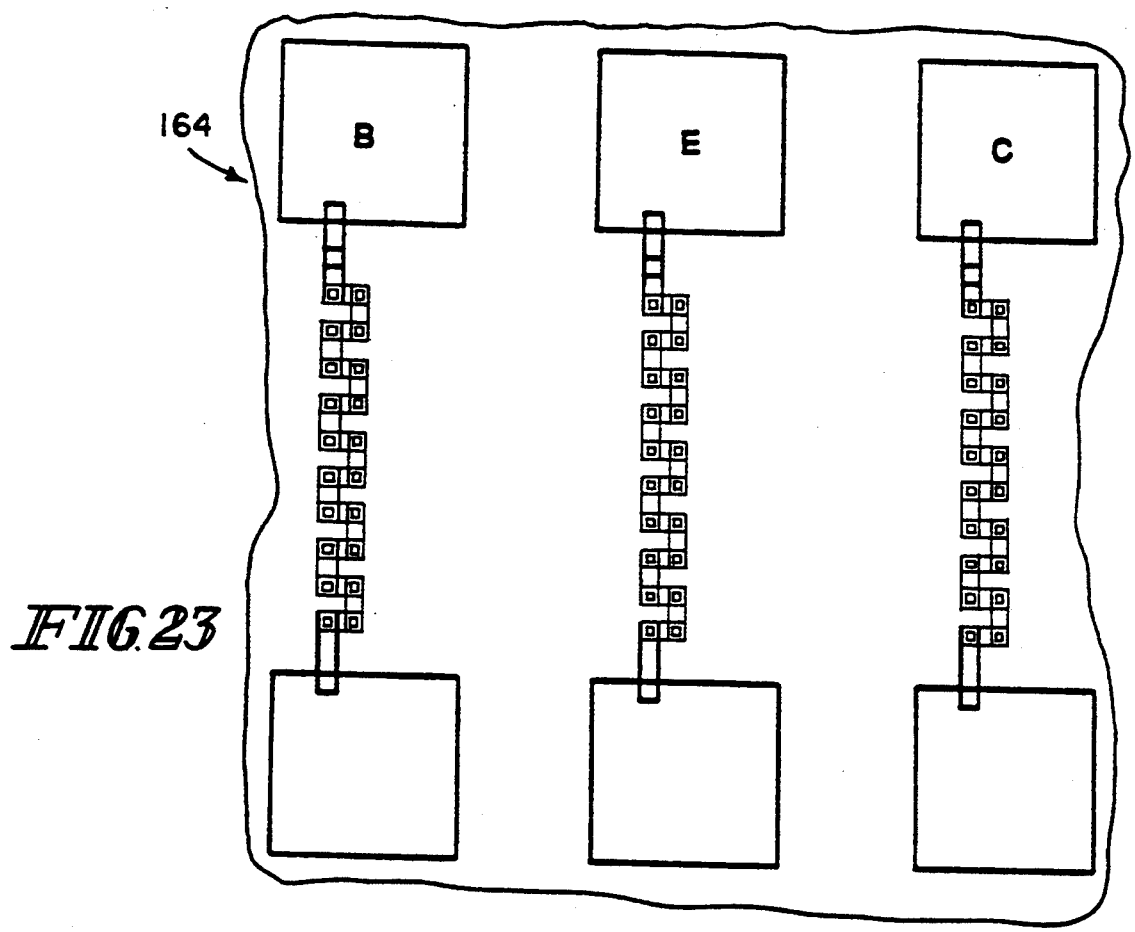
FIG. 23 illustrates a top plan views of, from left to right, base diffused contact strings, emitter diffused contact strings, and collector diffused contact strings.

The contact strings 164, illustrated in FIG. 23, were implemented only in the substrate. Combined with the diffused resistor information, the contact strings 164 provided an approximate value of the contact resistance of the metal to each region (C, B, E). The contact strings 164 for the base (B), emitter (E), and collector (C) regions were implemented in both 5 $\mu m \times 5$ $\mu m$ and 10 $\mu m \times 10$ $\mu m$ contact openings. This was necessary to determine contact resistance to both the minimum and maximum transistors.

Figure 24A:
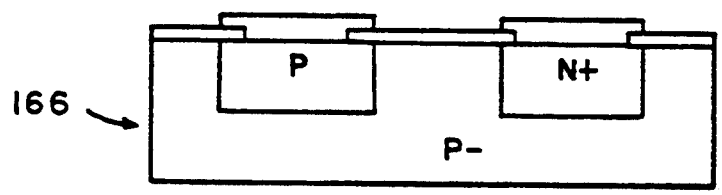
FIGS. 24a–b illustrate cross sections through, respectively, a base-collector diffusion test diode and a base-emitter diffusion test diode.
Figure 24B:
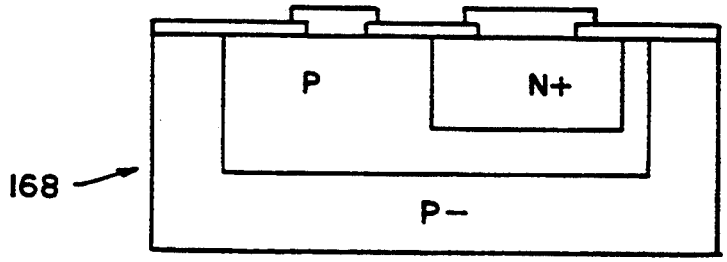

The base-collector 166 and base-emitter 168 diodes are illustrated in FIGS. 24a–b, respectively. These diodes 166, 168 permitted comparing the relative quality of the ELO crystal to the substrate material. By comparing measured parameters on each diode 166, 168, the relative quality of the ELO to the substrate was established.

Gate controlled diodes (GCDs) 170, illustrated in FIGS. 25a–b were also implemented in the ELO and the substrate. As with the diodes 166, 168, the GCDs 170 permitted comparison of the material quality of the ELO and the substrate.

The last test structures were 6 mm×6 mm squares which received each implant and drive-in. These squares were subjected to a spreading resistance profile (SRP) measurement, which measured the doping profiles of the devices. The test devices were also placed in a 6 mm×6 mm die, as illustrated in FIG. 26.

An alignment die (not shown) was used to align previous processes with current processes. The alignment die contained alignment structures as well as resolution marks. The resolution marks were useful for evaluating the quality of the photolithography process as well as the minimum geometries achievable with the process.

The mask set was designed to be flip-symmetric, that is, symmetric about a vertical line through the center of the mask. This constraint was imposed so that either a dark field or light field mask could be made from the same master mask. This allowed the use of either positive or negative resist during each fabrication step.

To make the mask set flip-symmetric, a mirror image had to be generated for each die. Each transistor die T and test die X and its mirror image were placed in a 4×4 array, as illustrated in FIG. 27. Alignment dies A were placed in four different locations to ensure proper mask alignment in all four quadrants. A row of four SRP squares S was placed at the top of this array, also in a flip-symmetric configuration.

Master copies of the masks were generated on the Cambridge EBMF 2.5 electron beam lithography machine. The master masks were defined in a thin chrome layer on a glass substrate using an electron beam. The electron beam generated masks were used because of their high degree of accuracy. These masters were copied onto photoplates for the actual processing. The mask copying procedure is described in Table 1.

Table 1

1) Place 3" mask jig in the Ultratech copying machine
2) Turn main power on
3) Place master mask, emulsion (chrome) side out, into the master mask holder
4) Turn master vacuum on
5) Place photoplate, emulsion side up, into the copy plate holder
6) Raise photoplate holder up to the master plate
7) The latch will engage, cycle will start and expose plate
8) When cycle ends and latch releases, remove photoplate
9) Develop photoplate in Kodak photoplate developer until photoplate is opaque
10) Rinse photoplate in DI water
11) Place photoplate in fixer for 4 minutes
12) Rinse photoplate in DI water
13) Let photoplate drip dry Processing of the ELO-QDI transistor comprised four basic steps. First, a basin or tub was etched into the silicon substrate with a silicon etch. Second, a seed hole for ELO was placed in the bottom of the tub. Third, ELO was grown to fill the tub. Fourth, the devices were built into the ELO-filled tub. The overall sequence is described in Table 2.

Table 2

1) Oxidation
2) Mask 1-Definition of Basins
3) Etch Basins
4) Strip Oxide
5) Isolation Oxidation
6) Mask 2-Seed Hole Definition and Etch
7) ELO Growth
8) Mask 3-Collector Definition
9) Collector Implant-Phosphorous
10) Oxidation-Collector Drive
11) Mask 4-Base Definition and Etch
12) Base Implant-Boron
13) Oxidation-Base Drive
14) Mask 5-Emitter Definition and Etch
15) Emitter Implant-Arsenic
16) Oxidation-Emitter Drive
17) Mask 6-Contact Opening
18) Mask 7-Metallization
19) Contact Anneal A known ELO process was used in the fabrication of the ELO-QDI structure. This transistor process was used solely to establish the feasibility of fabricating the desired structure. The process parameters were not optimized for high voltage or high current operation. Rather, they were intended to verify the feasibility of the ELO-QDI process and the quality of the ELO material grown in the basin.

The starting material was an N-type (100) 50–100 $\Omega$-cm wafer. The basins were rectangular in shape and oriented 45° to the <110> wafer flat, as illustrated in FIG. 28. This off-orientation aligns the basin edges along the <100> directions, which is necessitated by ELO growth constraints.

In order to etch a deep basin while maintaining angled sidewalls, the silicon etchant to be used had to be anisotropic. That is, the etchant had to etch the silicon faster in the <100> direction than in the <110> or <111> directions. Although several anisotropic etchants were available, the one chosen for the ELO-QDI process was a mixture of potassium hydroxide (KOH), water ($H_2O$), and N-propanol. W. E. Beadle, J. C. C. Tsai, R. D. Plummer, "Quick Reference Manual for Silicon Integrated Circuit Technology," *A Wiley Interscience Publication*, John Wiley & Sons, NY, 1985, p. 5-5. The $KOH:H_2O:$N-propanol solution provided good selectivity between the (100), (110), and (111) planes while providing a smooth bottom from which to grow the ELO.

The $KOH:H_2O:$N-PrOPanol solution was mixed, by weight, as follows: 23.4% KOH; 63.3% $H_2O$, and 13.3% N-propanol. This equated to 47 gm KOH, 127 ml $H_2O$, and 39 ml N-propanol. The solution was then heated to, and maintained at, 81° C. during the etch.

Several parameters were found to be critical to the basin etch procedure. First, the temperature had to be kept within 81° C.±1° C. to achieve a consistent etch rate. It was found that the etch rate was directly proportional to the temperature of the solution. Small variations in temperature led to large variations in the etch rate. At 81° C., the etch rate along the <100> direction was approximately 0.93 μm/minute. The etch rates along the (110) and (111) planes were extremely low in comparison. The masking oxide was consumed during the etch at a rate of approximately 20 Å/minute. This did not pose a problem, since the masking oxide was initially 2000 Å thick.

Figure 29:
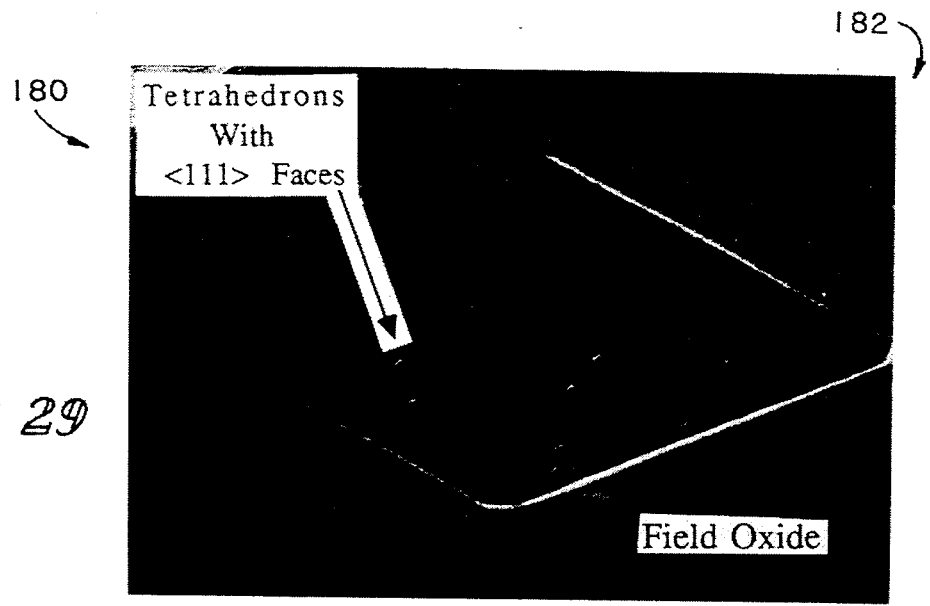
FIG. 29 illustrates in perspective a scanning electron microscope photograph of tetrahedron defects formed in a basin during an anisotropic etch.

Second, the cleaning of the glassware and wafer prior to the basin etch were crucial to eliminating etch defects in the basin. Since the basins were oriented with sidewalls along the <100> direction, any contamination present caused the formation of tetrahedrons in the bottoms of the basins. These tetrahedrons, with (111) facets, were nearly impossible to eliminate due to the low etch rate of the (111) plane. FIG. 29 illustrates an SEM photograph of tetrahedron etch defects 180 formed in a basin 182 during an anisotropic etch. The glassware and wafer were cleaned using the wafer cleaning procedure listed in Table 3, which is a standard procedure in the solid state laboratory. This procedure removed surface contaminants from both wafer and glassware, while leaving a thin layer of native oxide on the wafer.

Table 3

1. Mix 1:1 solution of $H_2O_2:H_2SO_4$
2. Place glassware/wafer in solution for 15 minutes
3. Rinse in DI water a minimum of 3 times The wafer was first dipped in BHF for 10 seconds, rinsed in DI, and immediately placed in the etchant. The mixture was then covered with a petri dish to prevent evaporation from the solution and to keep any contaminants from entering the solution. Originally, an aluminum foil was used to cover the solution, but the foil was found to react with the etchant, creating defects during the etch. Teflon coated tweezers were used when working with the etchant. Stainless steel tweezers were found to react with the solution.

Finally, vigorous rinsing of the wafer immediately upon completion of the etch was crucial. The etch rate was so high that any remaining etchant etched the bottoms of the basins unevenly. The detailed basin etch procedure is found in Table 4.

Table 4

Figure 30:
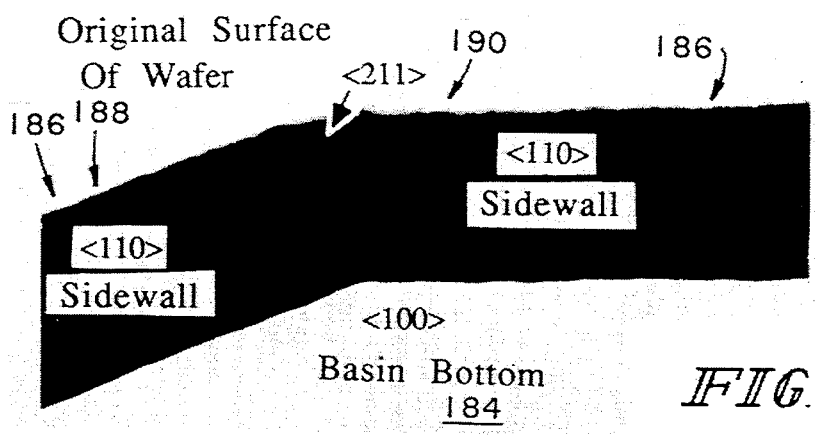
FIG. 30 illustrates in perspective a scanning electron microscope photograph of a portion of a basin bottom, basin sidewalls and the original surface of a wafer.

1) Clean glassware using wafer clean procedure
2) Mix the following solution in a 600 ml glass beaker;
   127 ml $H_2O$
   39 ml N-propanol
   47 gm KOH
3) Heat solution to 81° C. and maintain at 81° C.
4) Dip wafer in buffered hydrofluoric acid (BHF), 15 seconds
5) Rinse wafer in DI water
6) Place wafer in solution for 10 minutes
7) Cover solution with clean petri dish
8) Remove wafer from solution
9) Immediately rinse wafer vigorously in DI water
10) Blow wafer dry with $N_2$ The resulting basin 184 had a flat, smooth bottom on the (100) plane. The sidewalls 186 lay along the (110) plane and intersected the bottom 184 of the basin at 45°. The sidewalls, however, had on their faces (111) plane striations which terminated on the (110) plane. FIG. 30 illustrates an SEM photograph of an etched basin 188 with crystal planes indicated. In the basin corners 190, the etch terminated on (211) planes as indicated.

Figure 32:
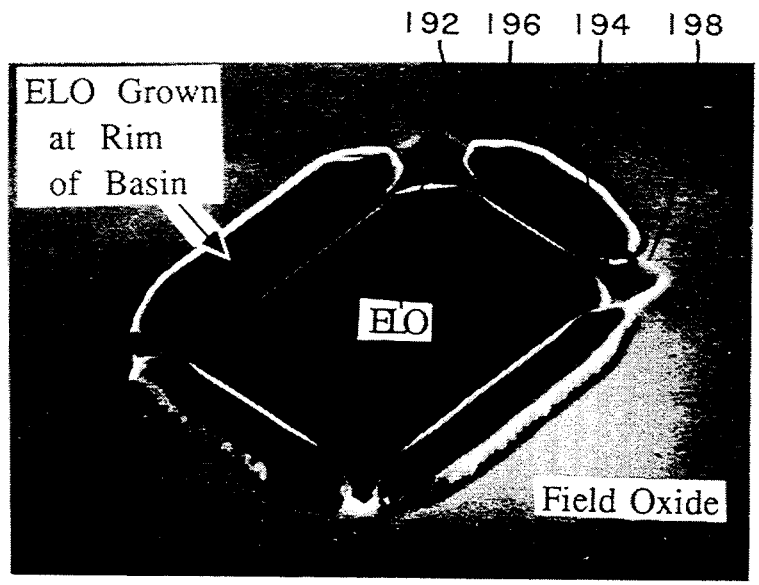
FIG. 32 illustrates in perspective a scanning electron microscope photograph showing ELO in a basin and around the rim of the basin where resist broke away.

Placing a seed hole in the bottom of the basin posed two challenges. First, photoresist had to stick along the sidewalls and at the basin edges. Second, the distance between the mask and the bottom of the basin allowed some diffraction to occur, which deteriorated the size and quality of the seed hole. The main problem was resist breakaway at the top edges of the basin rim. The resist at the edges was very thin and under high stress. The surface tension of the resist was high enough to break the resist at these high-stress edges, as illustrated in FIG. 31. This was a serious problem, because if the seed hole were etched when the resist had broken away, an ELO seed hole would have been opened up at the edge of the basin. As a result, ELO would have been grown at the edge of the basin, as well as in the basin, forming a large silicon step making metallization contact to the device impossible. FIG. 32 illustrates an SEM photograph of ELO 192 grown in a basin 194 in which resist broke away at the basin rim. The thickness of the ELO 196 along the rim 198 was approximately the same as the ELO 192 grown in the basin 194.

The resist which proved to work was Shipley AZ-4620 positive resist. This resist had a high viscosity, approximately 360 centistoke at 77° F. In order to coat the wafer without resist breakaway at the basin edges, the resist was spun on the wafer at 3000 RPM for 30 seconds. This provided a relatively thick resist coating of approximately 6 μm. This thick resist coverage required a much longer exposure time, experimentally determined to be 9 minutes. This long exposure required the automatic timer on the mask aligner to be bypassed, since the automatic timer was limited to 99.9 seconds. A manual shutter control on the aligner allowed manual exposure of the wafer. Development of the resist required a relatively concentrated solution of AZ-351 developer in water, and the ratio was determined to be 1:2, respectively, giving a development time of approximately 45 seconds. The detailed procedure for the application of the resist is given in Table 5.

Table 5

1) Clean wafers
2) Dry-bake wafers at 120° C., 15 minutes

3) Evaporate HMDS on wafers for 5 minutes
4) Center wafer on spinner chuck
5) Blow dust from wafer with $N_2$
6) Place 20–30 drops of resist on wafer
(Note: Ensure pattern is covered with resist prior to spin)
7) Spin wafer 3000 RPM, 30 seconds
1) Softbake resist 88° C., 15 minutes
9) Expose 9 minutes
10) Develop in 1:2 solution AZ-351 Developer:DI water
11) Rinse wafer in DI water at least 3 times
12) Hardbake resist at 120° C., 30 minutes Definition of the seed hole feature in the bottom of the basin was difficult using a contact aligner. FIG. 33 illustrates the configuration of the mask 200 and the basin 202 during seed hole definition. The distance (d) was large enough to create a diffraction pattern 204 from the mask feature 206 in the basin 202. The diffracted light intensity also varied as the light moved in from the edge 208 of the mask feature 206. As a result the seed hole was smaller than intended and its edges were not well defined. Seed hole reduction could be achieved by utilizing this diffraction phenomenon. Although the seed hole edges were not well defined, they were smooth and were found to be suitable for ELO growth.

ELO Growth is a complex series of chemical reactions involving a silicon source gas, a reactant gas, and a carrier gas. In the ELO-QDI process, the source gas was dichlorosilane ($SiH_2Cl_2$ or DCS), the reactant gas was hydrogen chloride (HCl), and the carrier gas was hydrogen ($H_2$). By selecting the proper gas ratios, temperature and pressure, silicon was grown out of the seed hole and laterally over the oxide. J. Friedrich, G. W. Neudeck, S. T. Liu, "Silicon Selective and Lateral Overgrowth Epitaxy: Growth and Electrical Evaluation for Devices," 18*th European Solid State Device Research Conference*, Montpellier, France, Sep. 13–16, 1988; M. Kastelic, I. Oh, C. G. Takoudis, J. A. Friedrich, G. W. Neudeck, "Selective Epitaxial Growth of Silicon in Pancake Reactors," *Chemical Eng. Science*, Vol. 43 No. 8, 1988, pp. 2031–2036; R. P. Zingg, G. W. Neudeck, B. Hoefflinger, "Epitaxial Lateral Overgrowth of Silicon Over Steps of Thick $SiO_2$," *Journal of Electrochemical Society*, Vol. 133 No. 6, 1986, pp. 1274–1275. The basic chemical reaction involves the decomposition of DCS into HCl and Si, depositing only on exposed Si. The overall chemical reaction is given as;

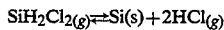

$$SiH_2Cl_{2(g)} \rightleftharpoons Si(s) + 2HCl_{(g)}$$

The actual reactions taking place are much more complex, since this reaction can remove Si from the wafer as well as deposit it. S. Wolfe, R. N. Tauber, "Silicon Processing For The VLSI Era Volume 1—Processing Technology," Lattice Press, Sunset Beach Calif., 1986, pp. 124–160; J. R. Schlais, G. W. Neudeck, S. T. Liu, "A Structure for Measuring Contact Resistances Immediately Following Metal Deposition," *Journal of Vacuum Science and Technology*, Vol. 6 No. 2, March/April 1988, pp. 579–581. The DCS provides a source of Si for ELO growth, while the HCl prevents nucleation and growth of Si on the oxide. The $H_2$ is a carrier gas used to distribute the source and reactant gases. By preventing the Si from nucleating on the field oxide, the ELO is grown single crystalline, maintaining the crystal orientation of the exposed substrate. Any nucleation on the oxide near the ELO could interact with the ELO and disrupt the crystal growth pattern. This could result in growth defects and adversely affect the electrical properties of the ELO.

Figure 34:
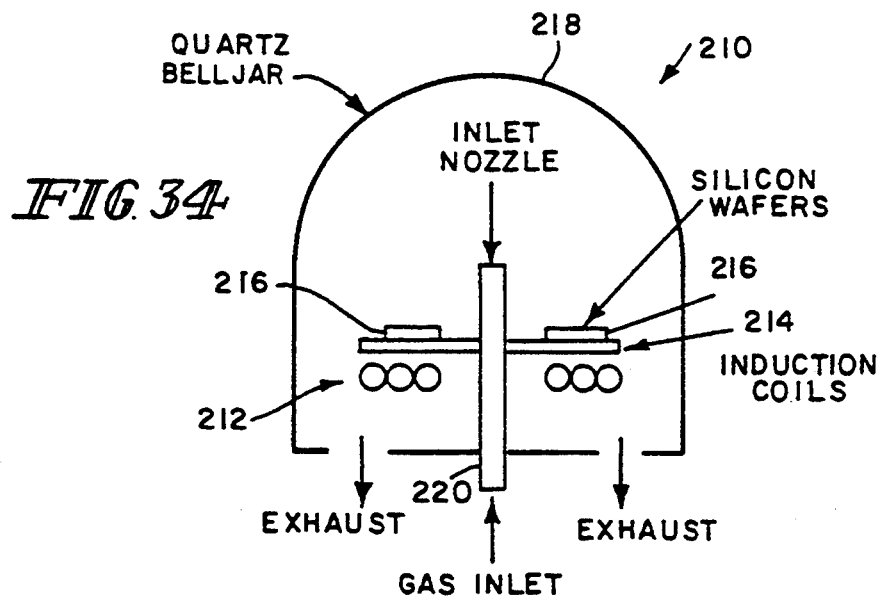
FIG. 34 illustrates a diagrammatic vertical sectional view through a Gemini pancake silicon epitaxial reactor.

The ELO was grown in a Gemini I silicon epitaxial low pressure chemical vapor deposition (CVD) reactor 210. The Gemini reactor is a radio frequency (RF) pancake-type reactor illustrated in FIG. 34. The RF coils 212 are located underneath the graphite "pancake" (susceptor) 214 on which the wafers 216 are placed. A quartz bell jar 218 covers the susceptor 214 and RF coils 212, sealing the reactor 210 for reduced pressure operation. During ELO growth, the reacting gases are injected into the bell jar from an inlet nozzle 220 located in the center of the susceptor 214. While performing ELO, the susceptor 214 rotates to help reduce the effects of localized gas ratio fluctuations which may occur in the reactor 210. The gas flow ratios of DCS, HCl, and $H_2$ were experimentally determined to maximize the ELO growth rate and minimize nucleation. Nucleation is more likely to occur during long growth cycles, thus making the gas flow ratio determination a critical step.

The wafer 216 cleaning procedure, prior to ELO growth, was one of the most important steps in the ELO process. With seed windows defined, the wafers 216 were cleaned using the wafer clean procedure in Table 3. The wafers were then dipped in BHF for 10 seconds and rinsed in DI just before placing them in the reactor 210. The BHF dip removed native oxide from the seed holes, and was done immediately before ELO growth. If the wafers 216 were allowed to sit for several hours after the BHF dip, a native oxide would form again, requiring another BHF dip.

Once inside the reactor 210, the wafers 216 were cleaned with a five minute $H_2$ bake and a 30 second HCl etch, both carried out at reduced pressure, 150 Torr, and reduced temperature, 950° C. The ELO was then grown at 150 Torr and 950° C.

Figure 35:
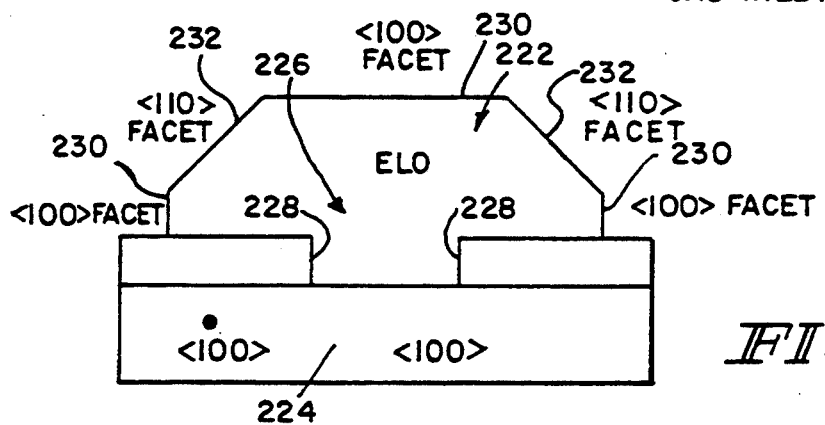
FIG. 35 illustrates a cross section showing facets formed during ELO when seed hole edges are oriented along the <100> direction.
Figure 36:
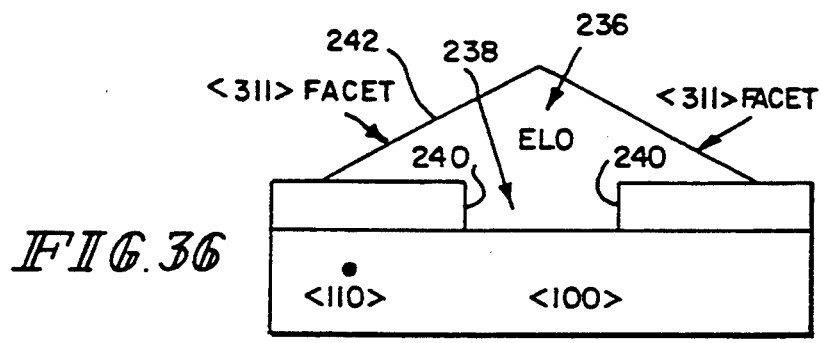
FIG. 36 illustrates a cross section showing facets formed during ELO when seed hole edges are oriented along the <110> direction.
Figure 37:
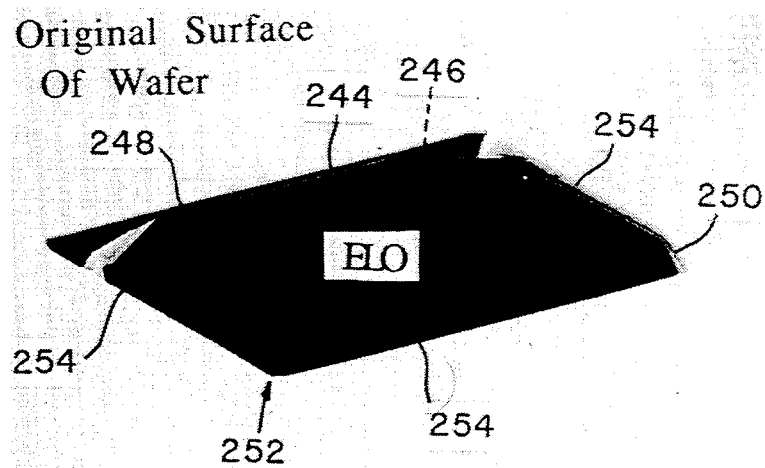
FIG. 37 illustrates a scanning electron microscope photograph of a perspective view of ELO grown in a basin.
Figure 38:
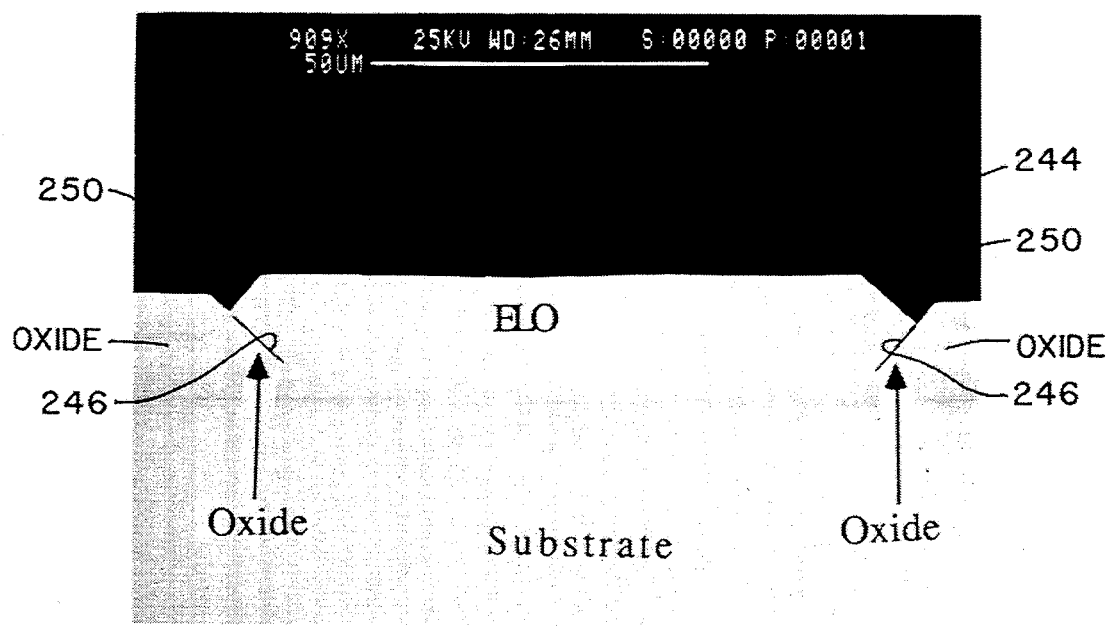
FIG. 38 illustrates a scanning electron microscope photograph of a cross section of ELO grown in a basin.

Once the ELO was above the oxide surface, the growth rate of Si in the vertical direction was approximately equal to the growth rate in the lateral direction, as illustrated in FIG. 35. FIG. 35 illustrates a cross sectional view of ELO 222 grown on a (100) substrate 224 with the seed hole 226 edges 228 aligned with (100) planes, as in the ELO-QDI process. The ELO growth 222 had (100) planes 230 on the top and sides, with (110) facets 232 formed on the corners, as indicated. FIG. 36 illustrates a cross section of ELO 236 grown from a seed hole 238 with edges 240 aligned with <110> directions. The facets 242 in this ELO formed (311) planes. As FIGS. 35–36 suggest the ELO surface area available for device fabrication was reduced by the crystal facets formed. The seed hole orientation along the <100> directions (FIG. 35) was chosen because of the smaller facet 232 formation and the planar surface 230, where devices were to be fabricated. The ELO 244 grown in the basin 246 had a relatively flat surface 248 and facet formation 250 in the corners 252 and along the edges 254 as illustrated in FIG. 37. FIG. 37 also illustrates that the ELO 244 appeared to be free of defects and the field oxide showed little or no nucleation. An SEM photograph of the cross section of the ELO 244 grown in the basin 246 is illustrated in FIG. 38. The cross-section in FIG. 38 illustrates the ELO 244 growth along the angled sidewalls. The sidewall oxide was removed with a BHF etch to delineate the ELO 244 from the substrate 256.

Immediately following growth of the ELO, the ELO and the sidewall oxide are weakly bonded, forming a rapid diffusion path for impurities. S. Hine, T. Hirao, S, Kayano, N. Tsubouchi, "A New Isolation Technology for Bipolar Devices by Low Pressure Selective Silicon Epitaxy," 1982 *Symposium on VLSI Technology*, Technical Digest, 1982, pp. 116–117. This rapid diffusion path is ideal for achieving the deep collector implants required. However, to take advantage of this weak bond, there must be no high temperature step immediately following ELO. A high temperature step, such as an oxidation, would anneal the ELO/SiO$_2$ interface, eliminating the rapid diffusion path.

The collector implant masking resist chosen was again Shipley AZ-4620 positive resist because of its thick coverage. During ion implantation, thinner resists were found to harden or "network" on the wafer surface. This was possibly caused by heat buildup of the wafer from the impinging ions. Once a resist networked on the wafer surface, it became extremely difficult to remove. By using a thick coat of AZ-4620 resist, the surface of the resist could network, leaving the resist underneath soft and easy to remove. The procedure in Table 5 was used, with the hard-bake omitted.

With the resist mask in place, the collector was implanted with a dose of $2 \times 10^{15}$ cm$^{-2}$ phosphorous at an implant energy of 35 KeV. The implant current was kept below 60 μA to reduce the effects of resist networking. The resist was then stripped in a beaker of acetone placed in an ultrasonic cleaner. The resist strip required approximately 20 minutes in the acetone. The resist came off the wafer in small pieces and sediment instead of dissolving in the acetone. This indicated that a certain amount of resist networking had occurred. The collector implant was driven in with a wet thermal oxidation (see Table 6) at 1100° C. for 35 minutes, giving a yellow/pink oxide corresponding to approximately 4200 Å of oxide.

TABLE 6

1) Clean wafer (Table 3)
2) Set desired furnace temperature on Tube 4, at least 30 minutes prior to oxidation
3) Place wafer in boat
4) Push boat into furnace, taking two minutes
5) Turn on O$_2$—flow rate 57.7, Glass Bead
6) Turn on H$_2$—flow rate 50.0, Stainless Steel Bead
7) Turn off N$_2$
8) Oxidize for required length of time
9) Turn on N$_2$
10) Turn off H$_2$
11) Turn off O$_2$
12) Pull boat from furnace, taking two minutes
13) Remove wafer from boat The base region was defined in the collector oxide, and implanted with a dose of $3 \times 10^{13}$ cm$^{-2}$ boron at an energy of 35 KeV. The ion current was again kept below 60 μA to avoid heating the wafer excessively. The base implant was driven in with a wet thermal oxidation (Table 6) at 1100° C. for 50 minutes, giving a blue/green oxide corresponding to approximately 5000 Å of oxide.

The emitter was defined and implanted with a dose of $3 \times 10^{15}$ cm$^{-2}$ arsenic at an energy of 35 KeV. The collector region also received the emitter implant in order to reduce the collector contact resistance. The implant was then driven in with a wet thermal oxidation (Table 6) at 1000° C. for 20 minutes, giving a yellow/gold oxide, corresponding to approximately 2000° Å of oxide.

Prior to the metallization process, contact openings were made to the base, emitter, and collector regions. The wafers were then cleaned using the wafer cleaning procedure, followed by a 10 second BHF dip and a DI rinse. The BHF dip removed the native oxide, allowing the metallization to come in intimate (atomic) contact with the Si. After cleaning, the wafers were placed in the Perkin-Elmer sputtering system. A 1% silicon-aluminum alloy was sputtered onto the wafers, to a thickness of 3000 Å. A more detailed discussion of the sputtering process is given in Table 7. The alloy was used in order to prevent rapid diffusion or "spiking" of the aluminum into the Si. The wafers were removed from the sputtering system, turned over, and the backside of each wafer was metallized using the same procedure.

The contact pads and metal lines were defined on the wafer using KTI-747R-105 negative resist. The remaining aluminum in the field was removed with an aluminum wet etch procedure described in Table 8. The resist was then stripped using the standard resist strip in Table 9. The contacts were then annealed in a furnace tube at 400° C., in a nitrogen (N$_2$) atmosphere for 20 minutes.

Table 7

1) Clean wafer (Table 3)
2) Dip wafer in BHF—10 seconds
3) Rinse wafer in DI
4) Blow dry wafter with N$_2$
5) Vent chamber—Press START and VENT buttons
6) Raise hoist—HOIST-UP button
7) Remove plate from rotating dish
8) Place wafers on plate, replace plate in dish
9) Lower hoist—HOIST-DOWN switch
10) Evacuate chamber— START and PUMP buttons
11) Wait until system pumps down to $5.0 \times 10^{-7}$ Torr
12) Fill in Log Book
13) Press START and GAS buttons
14) Switch FUNCTION switch to ST2 to read pressure
15) Open argon gas toggle—right side switch
16) Dial Nupro flow controller between 14 and 17
17) Turn RF power on—black switch on RF supply
18) Turn POWER button on—white button on chamber
19) Set TARGET SELECTOR to TARGET 1
20) Set TABLE POSITION to TARGET 3
21) Set LOAD dial to 6.0, TUNE dial to 4.0
22) Slowly turn up power using "POWER ADJUST" dial until plasma glows
23) Turn power to 300W FORWARD and less than 15W REVERSE Use TUNE dial for adjustment
24) Leave system in this mode for 10 minutes
25) Turn power down to 100W FORWARD and adjust TUNE to minimize REVERSE power
26) Turn TABLE POSITION to TARGET 3
27) Sputter deposit 1% Al-Si Alloy—100 Å/minute
28) Turn TABLE POSITION to TARGET 3
29) Turn POWER ADJUST for zero FORWARD power
30) Turn POWER button off
31) Turn RF button off
32) Turn argon gas off
33) Press START and VENT buttons 34) Raise hoist—HOIST-UP switch
35) Remove wafers
36) Lower hoist—HOIST-DOWN switch
37) Evacuate chamber—START and PUMP buttons

TABLE 8

1) Mix etchant in the following proportions:
   760 ml $H_3PO_4$
   30 ml $HNO_3$
   15 ml $CH_3COOH$
   50 ml $H_2O$
2) Place wafer in beaker, cover with etchant
3) Etch aluminum until metal pattern appears
4) Rinse wafer in DI

TABLE 9

1) Heat Nophenol-922 until it steams
2) Soak wafer in heated Nophenol-922 for 15 minutes
3) Remove wafer from Nophenol-922 and cool to room temperature
4) Rinse wafer in acetone
5) Rinse wafer in methanol
6) Rinse wafer at least 3 times in DI water

Final Process Summary

The final process sequence follows:
1) Initial Oxidation
   Wet Oxidation
   1100° for 40 Minutes
2) Basin Etch Lithography
   Define Basins in AZ-1350J-SF Resist
   Etch Oxide in BHF
   Strip Photoresist
3) Basin Etch
   Clean Wafers
   Clean Glassware
   Dip Wafer in BHF—10 Seconds
   Rinse Wafer in DI
   Place Wafer in Etchant—10 Minutes
   Vigorously Rinse Etchant From Wafer
4) Strip Initial Oxide
   Etch Oxide in BHF
   Rinse Wafer in DI
5) Isolation Oxidation
   Wet Oxidation
   1100° C. for 50 Minutes
6) ELO Seed Window Lithography
   Clean Wafer
   Define Seed Holes in AZ-4620 Resist
   Etch ELO Seed Windows in BHF
   Strip Resist
7) Grow ELO in Basin
   Clean Wafer
   Dip Wafer in BHF—10 Seconds
   Rinse Wafer
   Place Wafer in Silicon Epitaxial Reactor
   Pre-Clean Wafer—5 Minute $H_2$ Bake 30 Second HCL Etch 950° C., 150 Torr
   Grow ELO—55 minutes, 950° C., 150 Torr
      HCL Flow: 1.2 Liters/Minute
      DCS Flow: 0.22 Liters/Minute
      $H_2$ Flow: 60 Liters/Minute
8) Substrate Device Lithography
   Clean Wafer
   Define Substrate Devices in Field Oxide
   Etch Device Windows in BHF
   Strip Resist
9) Collector Implant
   Clean Wafer
   Define Collector Implant Area in AZ-24620 Resist
   Implant Phosphorous Dose $2 \times 10^{15}$ $cm^{-2}$ at 35 KeV
   Strip Resist
10) Collector Drive-in Oxidation
    Clean Wafer
    Wet Oxidation—1100° C. for 35 Minutes
11) Base Implant
    Clean Wafer
    Define Base Regions in KTI-747R-105 Resist
    Etch Oxide in BHF
    Strip Resist
    Clean Wafer
    Implant Boron Dose $3 \times 10^{13}$ $cm^{-2}$ at 35 KeV
12) Base Drive-in Oxidation
    Clean Wafer
    Wet Oxidation—1100° C. for 50 Minutes
13) Emitter Implant
    Clean Wafer
    Define Emitter and Collector areas in KTI-747R-105 Resist
    Implant Arsenic Dose $3 \times 10^{15}$ $cm^{-2}$ at 35 KeV
14) Emitter Drive-in Oxidation
    Clean Wafer
    Wet Oxidation—1000° C. for 20 Minutes
15) Contact Openings
    Define Contact Openings in KTI-747R-105 Resist
    Etch Contact Openings in BHF
    Strip Resist
16) Metallization
    Clean Wafer
    Dip Wafer in BHF—10 Seconds
    Rinse in DI
    Sputter 1% Si—Al Alloy—3000 Å
    Define Contact Pads and Metal Lines in KTI-747R-105 Resist
    Wet Etch Aluminum Alloy
    Strip Resist
    Anneal Contacts in $N_2$ Atmosphere, 400° C., 20 Minutes The ion implants were performed by technicians. The AZ1350J-SF resist lithography procedure is described in Table 10, while the positive resist removal is detailed in Table 11. The negative resist lithography procedure using KTI-747R-105 resist is described in Table 12, while the negative resist removal is outlined in Table 9.

TABLE 10

1) Clean wafer (Table 3)
2) Dry-bake at 120° for 15 minutes
3) Evaporate hexamethyldisilazane (HMDS) on wafer for 5 minutes
4) Center wafer on spinner chuck
5) Blow dust from wafer with N
6) Place 20–30 drops of AZ1350J-SF in center of wafer
7) Spin wafer at 4400 RPM for 30 seconds
8) Softbake resist at 88° C., 15 minutes
9) Expose 60 seconds
10) Develop pattern in 1:3 solution of AZ351 Developer:DI Water
11) Rinse in DI water
12) Hardbake resist at 120° C., 30 minutes

TABLE 11

1) Soak in acetone 5 minutes
2) Soak in methanol 5 minutes

3) Rinse in DI water at least 3 times

TABLE 12

Figure 39:
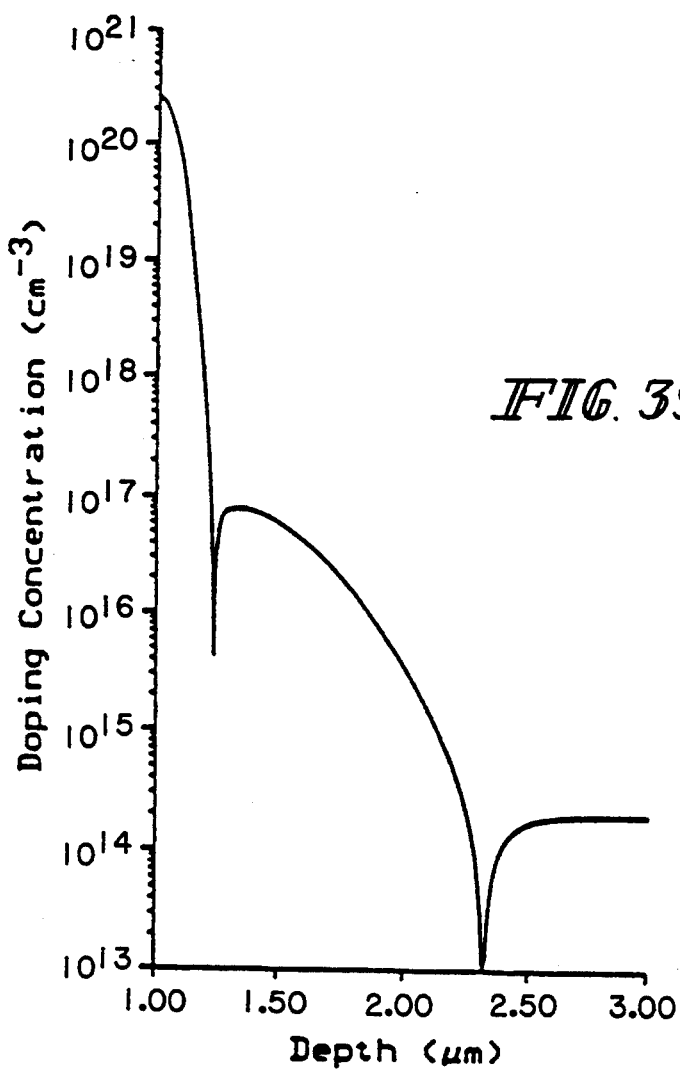
FIG. 39 illustrates a doping profile (doping concentration per $cm^3$ versus depth in $\mu m$) simulated using the SUPREM III program.

1) Clean wafer
2) Dry-bake wafer at 120° C., 15 minutes
3) Evaporate HMDS on wafer for 5 minutes
4) Center wafer on spinner chuck
5) Blow dust from wafer with $N_2$
6) Place 20–30 drops of resist in center of wafer
7) Spin wafer at 3500 RPM, 30 seconds
8) Softbake resist at 88° C., 15 minutes
9) Expose 15 seconds
10) Develop pattern in KTI-II developer
11) Rinse wafer in n-butyl acetate
12) Hardbake resist at 120° C., 30 minutes The SUPREM III simulated doping profile (using default parameters) for the given process is shown in FIG. 39. The profile shows the base-emitter junction depth $X_{jBE}=0.23$ μm, and the base-collector junction depth $X_{jBC}=1.30$ μm. This gives an estimated base width of 1.07 μm. SRP measurements performed indicate that $X_{jBE}=0.16$ μm and $X_{jBC}=0.39$ μm, giving a base width of 0.23 μm. The discrepancy is probably due to using the default parameters.

The test devices built in the substrate were not fabricated in the initial runs. In order to fabricate the substrate devices, the isolation oxide surrounding the ELO-QDI structure had to be removed. Since the transistor fabrication was determined to be more important until the process was shown to work, the substrate devices were sacrificed. All but the resistors were implemented strictly for comparison of the ELO to the substrate crystal quality. Subsequently, the sheet resistance was measured from the resistors in ELO for verification of the doping levels, while the quality of the ELO devices was determined from testing of the transistors. A final run, requiring an additional mask, was performed in order to obtain substrate devices. This masking step is step 8 in the final process sequence.

Figure 40:
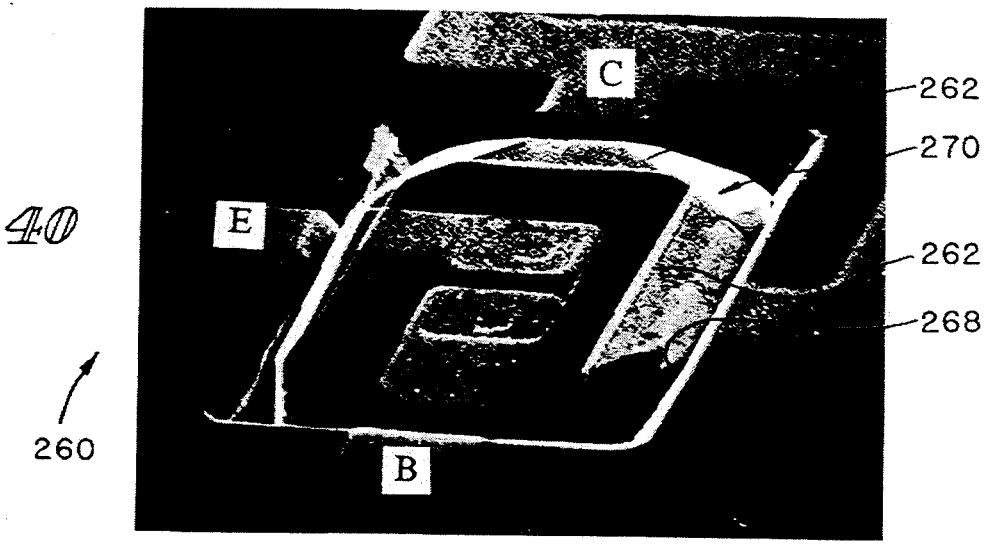
FIG. 40 illustrates a scanning electron microscope photograph of a perspective view of an HV ELO-QDI bipolar junction transistor.
Figure 41:
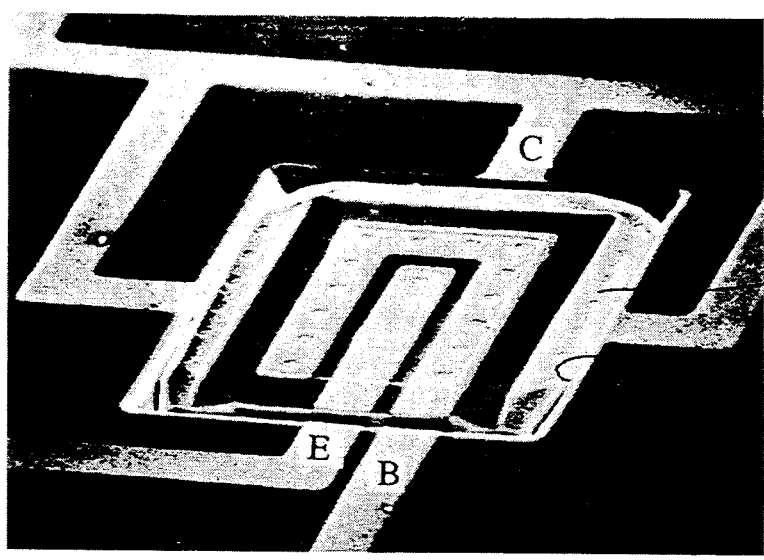
FIG. 41 illustrates a scanning electron microscope photograph of a perspective view of an HVHC ELO-QDI bipolar junction transistor.
Figure 42:
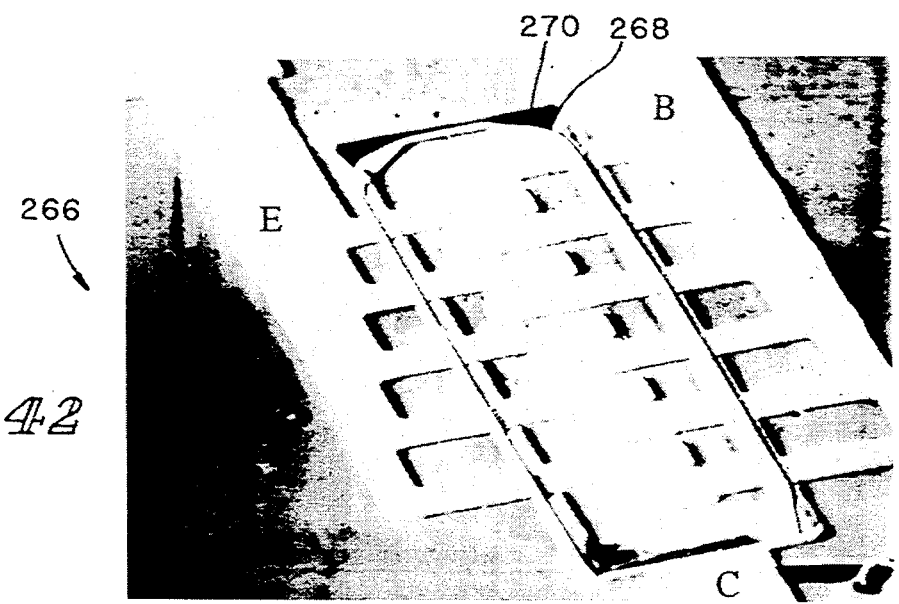
FIG. 42 illustrates a scanning electron microscope photograph of a perspective view of an HC ELO-QDI bipolar junction transistor.

A completed HV transistor 260 is illustrated in FIG. 40. As mentioned previously, the ELO facets 262 significantly reduced the surface area available for device fabrication. FIG. 41 illustrates the HVHC design 264, with its longer emitter E and larger base area B. FIG. 42 illustrates the HC design 266, with multiple emitters E. In each of these three transistors 260, 264, 266, the metallization lines E, B and C appear to be broken at the intersection of the basin edge 268 and ELO 270. However, testing revealed the metal lines were unbroken. The basin sidewalls 268 and ELO facets 270 acted as ramps for the metal lines, making a smooth transition from the bonding pads to device contacts.

Upon completing the processing, the wafers were diced using a Tempress Model 602 dicing saw. The dies to be tested were mounted in 28-pin DIP packages, and the devices were wire bonded to the packages. Wire bonding the die in a DIP package ensured good contact to the device. The packaged die was then placed in a light-tight box for testing. The box was filled with dry nitrogen to displace water vapor in order to reduce surface leakage currents caused by water vapor on the die.

The equipment used to test the devices included a HP-4145 Semiconductor Parameter Analyzer, a HP-09845 desk top computer, and a data analysis program on the Engineering Computer Network.

The transistors were tested for gains, leakage currents, junction ideality factors, Early voltages, punch through voltages, and junction breakdown voltages. Device data were taken with the transistors in the common emitter configuration.

Figure 43:
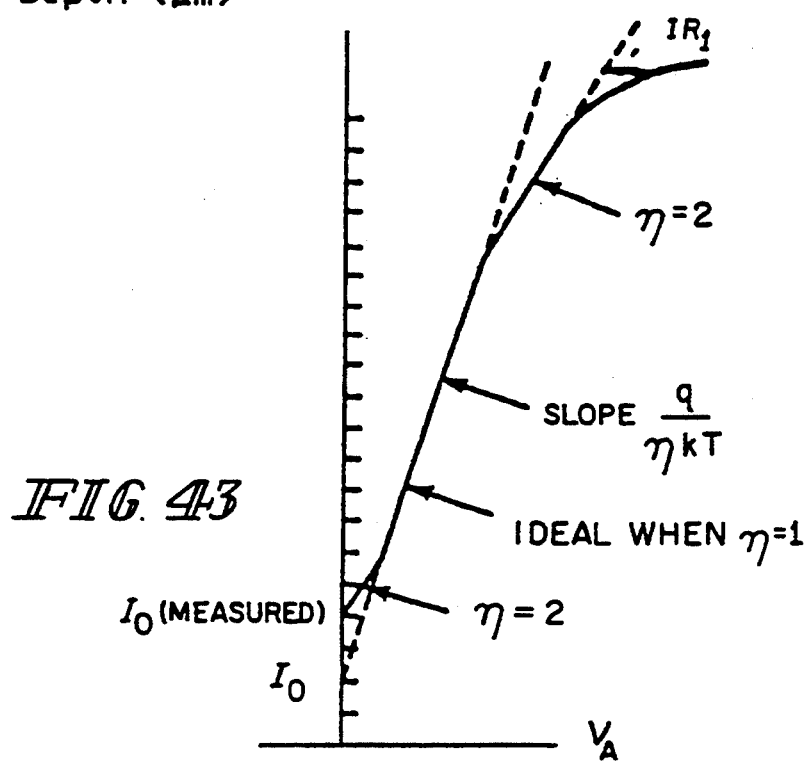
FIG. 43 is a graph illustrating how an ideality factor $\eta$ is determined from a forward biased junction characteristic.

The junction ideality factor, $\eta$, was derived from the slope of the forward active current curve, as illustrated in FIG. 43. G. W. Neudeck, "The PN Junction Diode," *Modular Series on Solid State Devices Vol. II* 2nd Ed., Addison-Wesley Publishing Co., Reading, March, 1989. The slope of the best fit (least mean square error) to a logarithmic straight line is equal to:

$$\frac{q}{\eta kT}$$

Since $q/kT$ is taken as constant, any variation in the slope is a function of $1/\eta$. The different regions of forward biased operation in FIG. 43 are recombination, diffusion, high level injection, and bulk resistance effects. If the $\eta$ in the diffusion region is close to 1.00, the current flow is diffusion-rather than recombination-dominated. If the $\eta$ approaches 2.00 at low current levels, recombination current dominates diffusion current. An $\eta$ approaching 2.00 in the diffusion region indicates crystal defects with a density high enough to cause significant recombination current. The higher the $\eta$ in this region, the higher the defect density. The ¢ factors for both the base-collector and base-emitter junctions are illustrated in the summary of transistor data given in Table 13. The data were obtained from several devices across the wafer. The $\eta$ varied widely across the wafer, which variations were probably caused by process variations over the wafer. It should be noted that no continuous pattern of $\eta$ factors was evidenced across the wafer. These $\eta$ factors are higher than for ideal junctions for both the base-emitter and base-collector junctions. The $\eta_{BC}$ was slightly higher than $\eta_{BE}$ indicating slightly more recombination current in the base-collector junction. This could have resulted from the much larger depletion region of the base-collector junction, owing to the relative doping levels of the base-collector junction compared to the base-emitter junction, and the higher probability for recombination to occur.

TABLE 13

| Average Device Parameters | HV | Transistors HVHC | HC |
|---|---|---|---|
| $J_{CBO}$ ($\times 10^{-7}$ A/cm$^2$) | 7.45 | 1.80 | 2.96 |
| $J_{EBO}$ ($\times 10$/cm$^2$) | 1.02 | 1.08 | 1.57 |
| $\eta_{BE}$ | 1.13 | 1.14 | 1.15 |
| $\eta_{BC}$ | 1.11 | 1.09 | 1.11 |
| $V_{BR-BC}$ | >100 | 95 | 95 |
| $V_{BR-BE}$ | 16 | 15 | 15 |
| $V_A$ | 100 | 92 | 43 |
| $V_{CEO-BREAKDOWN}$ | 67 | 82 | 63 |
| Peak Gain | 226 | 105 | 125 |

Reverse biased diode leakage currents are also a relative measure of the device quality. A high leakage current indicates large minority carrier generation in the depletion region of the junction, or a large surface leakage current. Since the device geometries were so large, leakage current was thought to be due primarily to bulk effects and not surface effects. Large generation currents imply high defect or metallic impurity densities in the crystal. The transistor junction leakage currents were each measured under a reverse bias of 3 V. Leakage current measurements, again from several devices across the wafer, were averaged and are also illustrated in Table 13. Note that these devices received no gettering process such as backside polysilicon deposition, backside damage, or POCl3 deposition.

Junction breakdown voltages, $V_{BR}$, are particularly important in high voltage operation. As $V_{CE}$ becomes large, the majority of the $V_{CE}$ voltage drop takes place across the reverse biased base-collector junction. This requires the base-collector junction to have a large breakdown voltage, achieved with a lightly doped collector region. Typical values for the breakdown voltages are also listed in Table 13. The base-emitter junction $V_{BR}$ is relatively low simply from the high doping levels on both sides of the junction. The base-collector $V_{BR}$ is quite a bit higher, which is desirable. Junction breakdown voltages were the last parameters tested, since subjection of devices to junction breakdown has been demonstrated to degrade device performance. A reduction of $\beta$ has been demonstrated to occur after junctions experience reverse bias avalanche breakdown. S. P. Roshi, R. Lahri, C. Lage, "Poly-Emitter Bipolar Hot Carrier Effects in an Advanced BiCMOS Technology," *IEDM Conf. Dig.*, December 1987, pp. 182–185.

Figure 44:
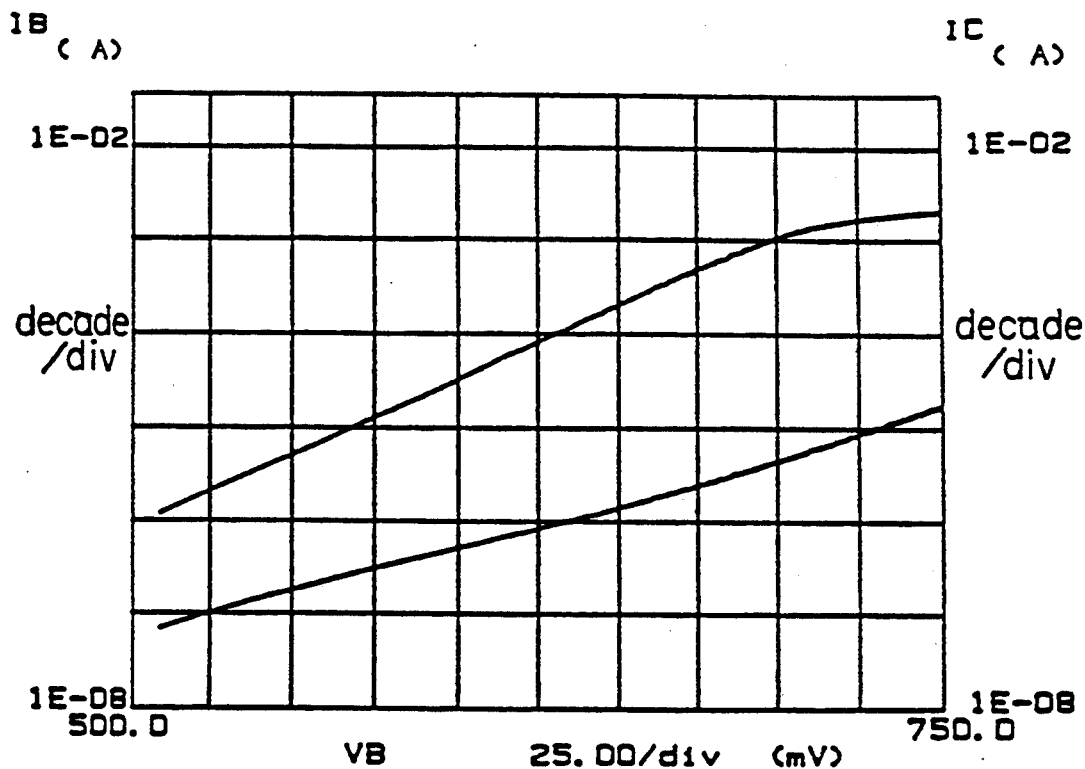
FIG. 44 illustrates a Gummel plot for a typical HVHC transistor.
Figure 45:
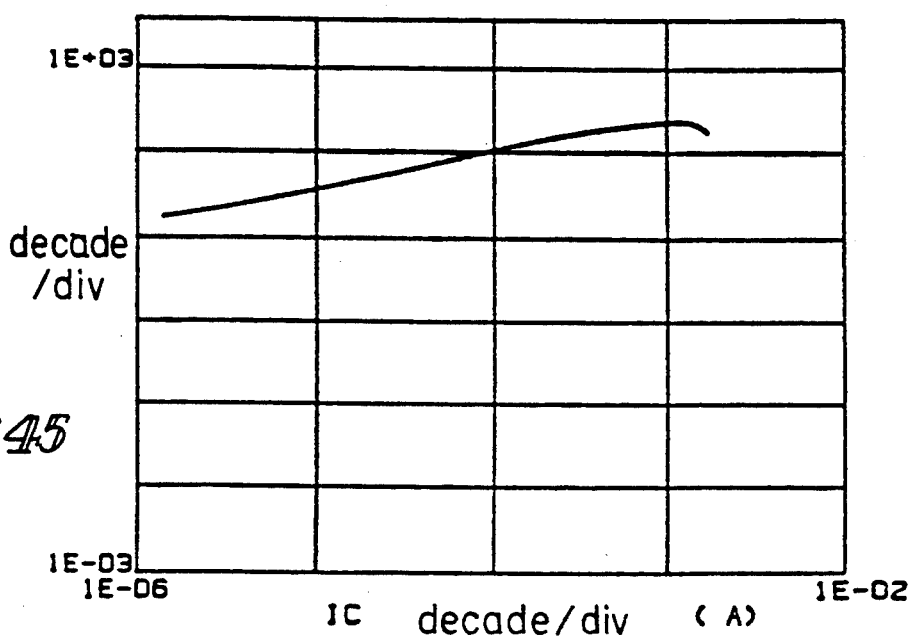
FIG. 45 illustrates a graph of $\beta$ versus $I_C$ for a typical HVHC transistor.

Transistor DC current gain $\beta$ is defined as the ratio of the collector current $I_C$ to the base current $I_B$. The peak $\beta$ was obtained from Gummel plots such as the one illustrated in FIG. 44 and peak $\beta$s ranged from 105 to 226 as illustrated. FIG. 45 illustrates a typical $\beta$ vs. $I_C$ plot of an HVHC transistor. The Gummel plot, also for the HVHC design, illustrates that $\beta$ is relatively constant over a nearly one and a half decade change in $I_C$ current. The decline in $\beta$ at about $I_C = 1$ mA is probably due to high collector resistance, although current crowding, high level injection, or a combination of these effects could also be contributing factors.

Figure 46:
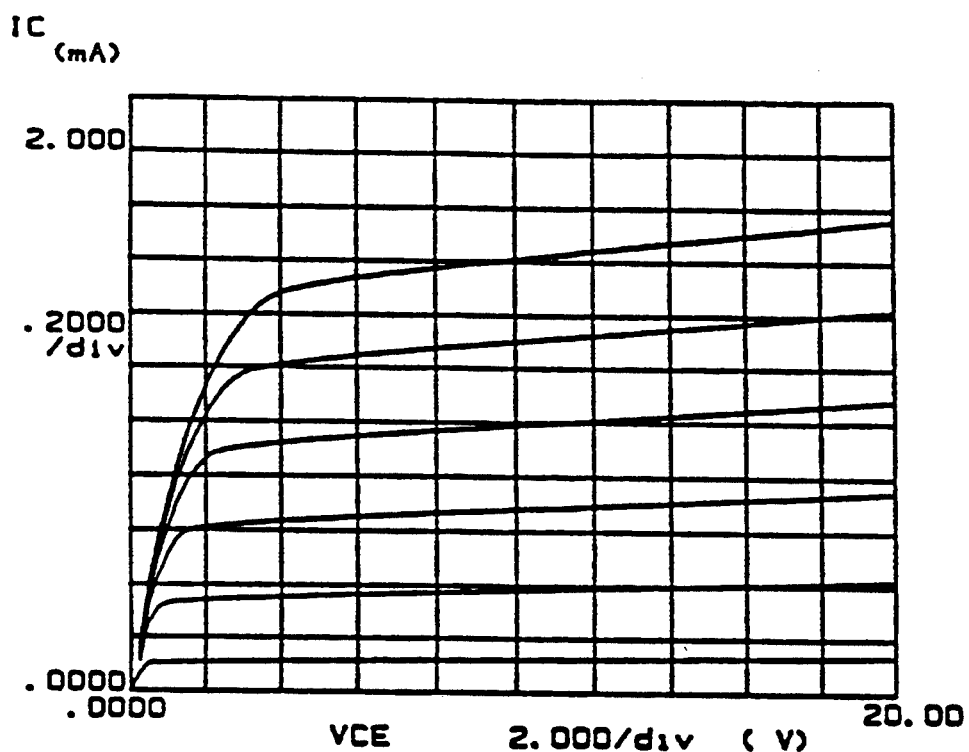
FIG. 46 illustrates graphs of $I_C$ versus $V_{CE}$ for several $I_B$'s for a typical HVHC transistor.
Figure 47:
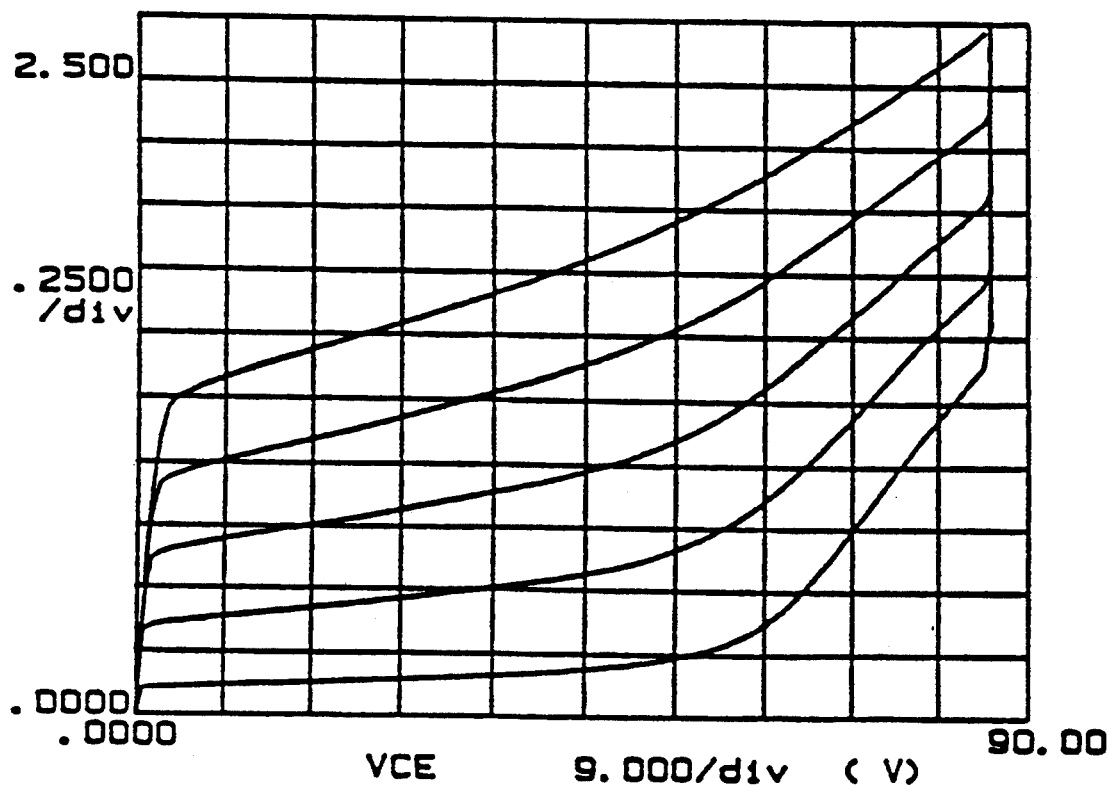
FIG. 47 illustrates graphs of $I_C$ versus $V_{CE}$ for several $I_B$'s for a typical HVHC transistor extended out to the $V_{CE}$ at which the transistor breaks down.

As the $V_{CE}$ operating voltage increases, the base-collector depletion region extends further into the base region. As the base becomes increasingly depleted, the effective base width begins to decrease. A narrower base in turn has the effect of increasing the $\beta$. The Early voltage $V_A$ is a relative measure of the amount of base-width narrowing or "modulation" taking place in the base of the transistor. The Early voltage $V_A$ was extracted from the $V_{CE}$ vs $I_C$ curves using the HP-9845 computer and a data analysis program. The forward active curves are extrapolated until they intersect the $V_{CE}$ axis, with the voltage at this intersection being taken as $V_A$. The low $V_A$ indicates a higher base doping is needed to keep the depletion region from narrowing the base and to provide a more constant $\beta$. The average $V_A$ varied from 43 V to 100 V, also as illustrated in Table 13. A high $V_A$ indicates little base-width modulation is occurring, while a low $V_A$ indicates significantly higher base-width narrowing. A typical $V_{CE}$ vs. $I_C$ curve, from a HVHC transistor, is illustrated in FIG. 46. FIG. 46 illustrates transistor operation out to a $V_{CE}$ of 20V. The $V_{CE}$ vs. $I_C$ curves are relatively flat over this large voltage range. FIG. 47 illustrates $V_{CE}$ vs $I_C$ curves showing breakdown of the HVHC transistor. The curves gradually turned upward until the transistor broke down at approximately $V_{CE} = 85$ V. The $V_{CE}$ breakdown voltage with the base open was also approximately 85 V. The curves in FIG. 47 also illustrate an interesting transition at about 65 V. At this voltage, the upward curvature stops and the curves become linear once more, only at a steeper slope. This slope, which appears to be a resistive effect, was maintained until the transistor broke down. The cause of this phenomenon is not yet known.

Piping, the rapid diffusion of impurities along crystal dislocations, was not observed. If piping had been present, the $V_{CE}$ vs. $I_C$ curves would have shown a more gradual increase in current at breakdown. If the emitter aluminum contact had piped through the emitter, the base and emitter effectively would have been short circuited and the transistor would not have worked properly.

Gate controlled diodes (GCDs) were used to investigate relative bulk crystal quality and oxide-silicon interface quality by determining generation lifetimes, under the gate as well as the junction, and surface recombination velocities. A detailed description of the operation of the GCD appears in D. K. Schroder, "Advanced MOS Devices," *Modular Series on Solid State Devices*, Addison-Wesley Publishing Co., Reading, March, 1987. Generation lifetimes are related to the relative density of recombination/generation (R-G) centers in the bulk material. An R-G center can result from a defect in the crystal lattice such as a point defect, dislocation, or stacking fault, or by the presence of metallic impurities forming mid-gap centers. Table 14 illustrates lifetimes and surface recombination velocities for GCDs in both ELO and the substrate. Data from GCDs were taken from across the wafer and averaged. The generation lifetimes under the gate ($T_g$-G) and under the junction ($T_g$-J) were found to be comparable, as indicated in Table 14. The surface recombination velocity ($S_o$) is a relative measure of the rate of carrier recombination at the silicon-oxide interface. As with the generation lifetimes, $S_o$ was comparable in the ELO and substrate. The close correlation of lifetimes and $S_o$ confirmed that the ELO material was of comparable quality to the substrate.

TABLE 14

|  | $T_g$-J ($\times 10^{-6}$) sec | $T_g$-G ($\times 10^{-6}$) sec | $S_o$ cm/sec |
| --- | --- | --- | --- |
| ELO | 27.0 | 21.1 | 18.7 |
| Substrate | 16.1 | 14.7 | 9.7 |

Diodes were placed in the substrate as well as in ELO. This was done in order to draw a comparison between the different materials. Table 15 lists the $\eta$ factors, leakage current densities, and breakdown voltages for both the base-collector and base-emitter diodes. The $\eta$ factors were larger than 1.00, indicating that some recombination current was present at low current levels. Leakage current density $J_{EBO}$ was much higher than $J_{CBO}$, although both ELO and substrate devices provided comparable results for the base-collector junction. The $\eta$ for the base-emitter junction in the substrate was significantly higher than in the ELO. However, the leakage current density in the ELO material was much higher than in the substrate. Breakdown voltages were also similar in both materials.

TABLE 15

|  | ELO | | Substrate | |
| --- | --- | --- | --- | --- |
|  | B/E | B/C | B/E | B/C |
| $\eta$ | 1.07 | 1.13 | 1.34 | 1.23 |
| $J_o$ (A/cm$^2$) | $5.70 \times 10^{-6}$ | $5.32 \times 10^{-7}$ | $3.20 \times 10^{-5}$ | $2.54 \times 10^{-7}$ |
| $V_{BR}$ | 16 | >100 | 17 | >100 |

Resistor data, illustrated in Table 16 were used to determined the actual doping levels of the base, emitter, and collector regions without using an SRP. The measured values were compared to SUPREM II values. As Table 16 indicates, the simulated values were often very different than the measured values. The high base and base-pinch resistances indicated a very lightly doped base, which also confirmed the base-width modulation observed in the $V_{CE}$ vs. $I_C$ curves. The high collector resistance indicated that the rapid decrease in $\beta$ was due to high collector resistance. The emitter sheet resistance was close to the expected value, although the measured value was higher.

TABLE 16

| Resistor | Sheet Resistance (Ohms/□) | |
|---|---|---|
| | Measured | SUPREM II |
| Base | 5.95K | 2.88K |
| Emitter | 106 | 99.5 |
| Collector | 133 | 47.1 |
| Base Pinch | 30.3K | 7.7K |

Fabrication of the ELO-QDI structure required that several technical challenges be met. First, a basin etch procedure had to be established. Second, an ELO seed hole lithography procedure had to be developed. Third, ELO had to be grown in a deep basin. Fourth, the ELO quality had to be verified electrically.

The basin etch was a crucial step in the ELO-QDI fabrication. The basin bottom had to be kept free of etch induced defects, such as the formation of tetrahedrons, for growth of device quality ELO. This procedure was successfully developed. Although anisotropic etching of silicon is a standard process in the literature, the specific procedure required special techniques to be developed.

The ELO seed hole lithography procedure, a completely new process, was successfully developed. By using AZ-4620 resist, and a long exposure time, resist breakaway was eliminated and seed hole lithography was successful. Although the seed hole features were not perfectly defined, they were certainly adequate for ELO growth.

ELO growth was successfully carried out in deep basins. By experimentally determining the proper gas flow ratios and growth time, thick ELO was grown with virtually no nucleation on the oxide. The ELO growth rate was approximately 0.16 µm/minute.

The quality of the ELO in the basin was verified electrically in the fabricated transistors. The ideality factors, leakage currents, DC current gains, and junction breakdown voltages indicated that the ELO was of device quality.

Several improvements to the ELO-QDI structure could be implemented to enhance device performance. First, a projection aligner could be used for defining an ELO seed hole in the basin. A projection aligner could provide better seed hole definition by focusing the pattern more deeply in the basin. Second, a buried layer could be incorporated in the process to reduce collector resistance. Third, N− ELO could be grown from the basin and planarized to provide a planar surface and achieve a minimum geometry device. Fourth, a larger base width could be provided for higher voltage (100 V and up) operation. Fifth, a polysilicon emitter process could be incorporated, replacing the present emitter process, to enhance the current gain of the device and reduce the lateral dimensions. R. Bagri, G. Neudeck, W. Klaasen, J. Pak, J. Logsdon, "A Comparison of Different Deposition Techniques for Fabricating Polysilicon Contacted Emitter Bipolar Transistors," 1988 *Bipolar Circuits and Technology Meeting*, Minneapolis, Minn., September 12-13, pp. 63-66, 1988.

Figure 48A:
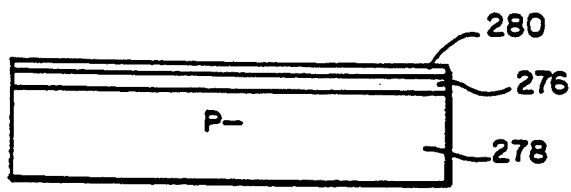
FIGS. 48a–e illustrate a processing sequence for ELO-QDI.
Figure 48B:
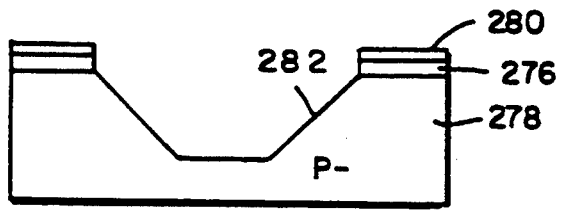
Figure 48C:
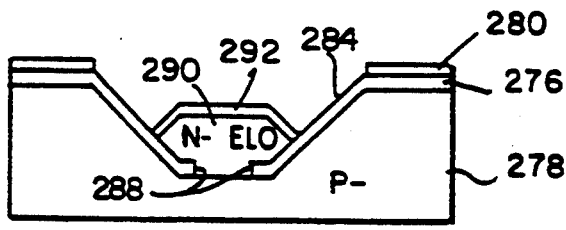
Figure 48D:
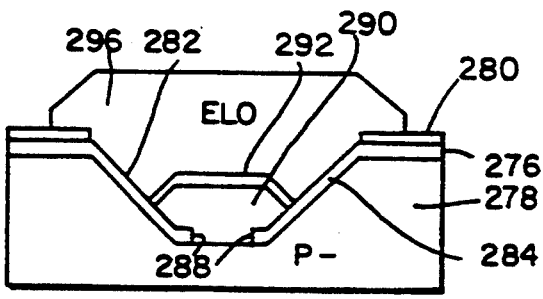
Figure 48E:
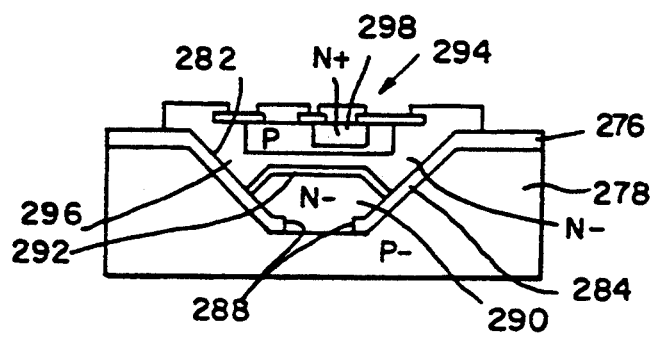
Figure 49:
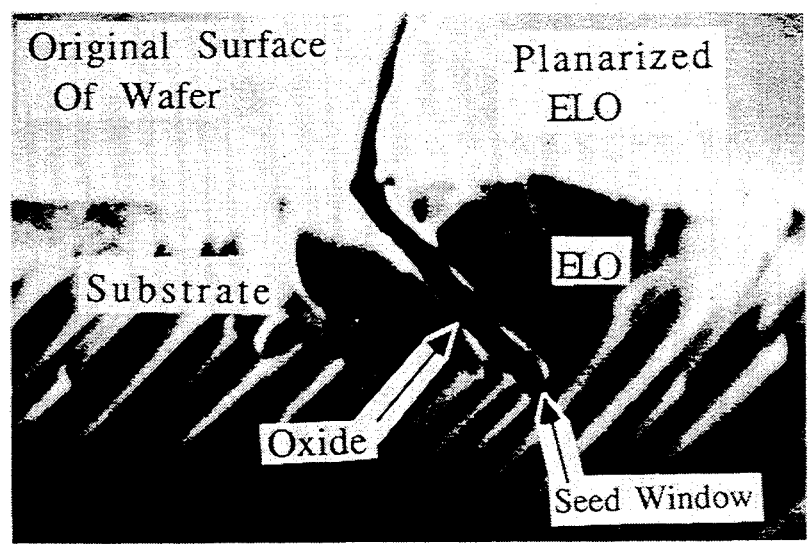
FIG. 49 illustrates a top plan view of ELO grown in a basin and then planarized; and, FIG. 50 illustrates a scanning electron microscope photograph of a cross section of ELO grown in a basin and then planarized.
Figure 50:
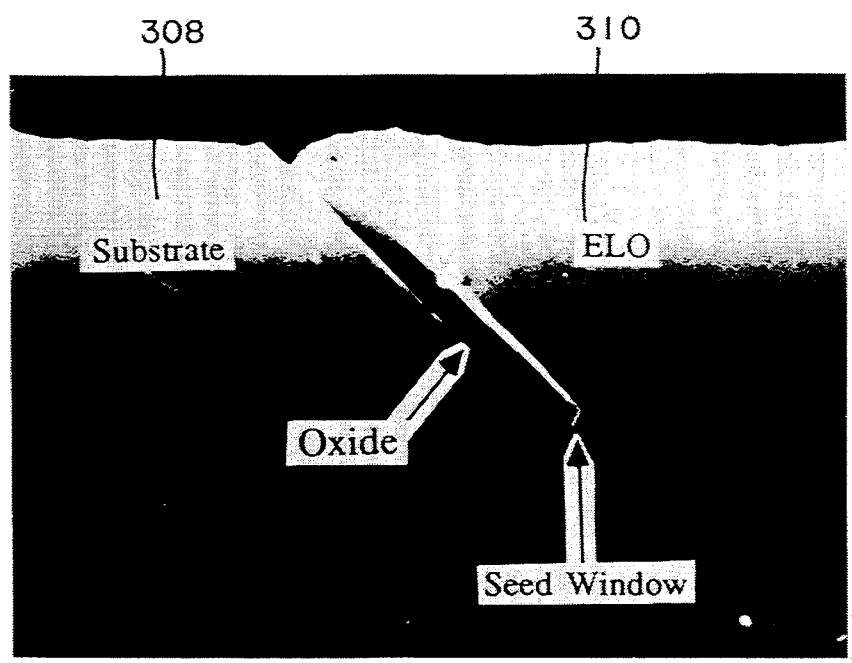

A proposed process sequence, illustrated in FIGS. 48a-e, incorporates these improvements. First, in FIG. 48a, $SiO_2$ is grown 276 on a P-type (100) substrate 278, followed by a chemical vapor deposition (CVD) of $Si_3N_4$ 280. In FIG. 48b, the basin 282 geometry is defined and etched in both the $SiO_2$ 276 and $Si_3N_4$ 280. The basin 282 is etched, isolation oxide 284 thermally grown (FIG. 48c), and an ELO seed hole 288 is defined in the basin 282. ELO 290 is grown N− from the seed hole, partly filling the basin, and implanted N+ 292. This implanted layer 292 forms the sub-collector for the transistor 294. In FIG. 48d, a second ELO 296 is grown N−, using the first ELO 290 as a seed. The second ELO 296 is grown out of the basin 282, and planarized (FIG. 48e) back to the $Si_3N_4$ surface 280 which acts as an etch stop for the mechanical-chemical process. The $Si_3N_4$ layer 280 is stripped (FIG. 48e), and the transistor 294 is fabricated in the basin 282, using a polysilicon emitter 298 as illustrated. FIG. 49 illustrates a top view of a planarized ELO growth 300 in a basin 302 32 µm×50 µm. The dark ring 304 around the filled basin 302 is the isolation oxide. Varying shades 306 of grey around the basin 302 correspond to variations in field oxide thickness. FIG. 50 illustrates an SEM cross section of planarized ELO. The isolation oxide was stripped to delineate the surrounding substrate 308 and the ELO 310.

The growth of a second layer of ELO from previous ELO has been performed. This second ELO has been shown to be of device quality. J. W. Siekkinen, W. A. Klaasen, G. W. Neudeck, "Selective Epitaxial Growth Silicon Bipolar Transistors for Material Characterization," 1988 *Bipolar Circuits and Technology Conference*, Minneapolis, Minn., September 12-13, pp. 237-240, 1988, which is incorporated herein by reference. Furthermore, a low temperature polysilicon emitter process has also been developed. This polysilicon emitter process has been shown to enhance the current gain by more than a factor of 3. R. Bagri et al., supra.

With the basic ELO-QDI, double ELO growth, and polysilicon emitter processes established, it seems feasible to incorporate these processes into one device similar to that illustrated in FIG. 48.

What is claimed is:

1. A method of isolating semiconductor devices comprising the steps of
   first providing a base layer of a first semiconductor majority carrier type, the base layer having a surface,
   next forming in the surface a basin having a sidewall and a bottom,
   next forming an insulative coating on the surface and the sidewall and bottom of the basin,
   next forming an opening in the insulative coating in the bottom of the basin, and
   next selectively depositing semiconductor material of a second and opposite semiconductor majority carrier type into and substantially filling said basin such that the deposited second type material assumes generally the same crystalline structure as said base layer in contact with said exposed base layer and said insulative coating on said side wall and any of said insulative coating on said bottom without polycrystalling thereon by preventing nucleation and growth of semiconductor material on the insulative coating so that said second type material is junction isolated at said opening and dielectrically isolated at said insulative coating from said base layer.

2. The method of claim 1 and further comprising the step of forming a semiconductor device with the second type material thus deposited.

3. The method of claim 1 wherein the step of forming in the surface a basin comprises the steps of forming a second insulative coating on the surface of the base layer, next providing an opening through the second insulative coating at the intended location of the basin, next forming the basin through the opening, and then removing the second insulative coating.

4. The method of claim 2 wherein the step of forming a semiconductor device comprises the steps of first implanting a collector region, then driving in the collector region, then implanting a base region, then driving in the base region, then implanting an emitter region, then driving in the emitter region while simultaneously forming a second insulative coating, then forming openings for metallic contacts to the collector, base and emitter regions through the second insulative coating, and then depositing metallic contacts through the last-mentioned openings.

5. The method of claim 1 wherein the step of first providing a base layer of a first semiconductor majority carrier type comprises the step of providing a base layer of P-type silicon, and the step of depositing into the basin semiconductor material of a second and opposite semiconductor majority carrier type comprises the step of depositing into the basin N-type silicon.

6. The method of claim wherein the basin is so oriented with respect to the surface of the base layer that the bottom of the basin in generally perpendicular to the <100> crystal direction and the sidewall of the basin has a component extending in the <100> crystal direction.

7. The method of claim 1 wherein the step of depositing into the basin second type material comprises the steps of depositing into the basin second type material, halting the deposition of second type material before the basin is filled, then implanting second type impurities to increase the impurity concentration at the surface of the second type material, then depositing onto the implanted surface second type material to fill the basin.

8. The method of claim 3 wherein forming said second insulative coating includes forming a layer of silicon dioxide on the base layer, then forming a layer of silicon nitride on this layer of silicon dioxide, and wherein providing an opening includes forming the geometry of the basin through these silicon nitride and silicon dioxide layers.

9. The method of claim 8 wherein said second type of material is selectively deposited to fill the basin and extend upward and outward from the basin, and subsequently, said second type material is planarized to the silicon nitride layer.

10. The method of claim 1 wherein said second type of material is selectively deposited to fill the basin and extend upward and outward from the basin, and subsequently, said second type material is planarized.

11. The method of forming electrically isolated devices comprising:

(a) oxidizing the surface of a monocrystalline semiconductor substrate;
(b) removing a selected portion of the oxidized surface to define a window therein through which the underlying semiconductor substrate is exposed;
(c) removing a selected amount of the semiconductor substrate from the portion of the semiconductor substrate which is exposed by the window in the oxidized surface so as to define a well in the semiconductor substrate, with the well having generally vertically oriented walls and a generally horizontally extended floor;
(d) removing the remaining oxidized surface from the semiconductor substrate;
(e) reoxidizing the entire surface of the semiconductor substrate, including the floor and walls of the defined well;
(f) removing a selected portion of the reoxidized surface from the floor of the well so as to expose the underlying portion of semiconductor substrate;
(g) selectively forming an epitaxial layer of monocrystalline semiconductor material in the well, with the epitaxial layer extending from the exposed underlying portion of the semiconductor substrate onto said oxidized surface of said side wall and any of said oxidized surface of said floor without polycrystalline thereon by preventing nucleation and growth of semiconductor material on the oxidized surface and to a level substantially equivalent to the oxidized surface surrounding the well; and,
(h) forming an electronic device with the epitaxial layer of semiconductor material so that the resulting structure separates devices laterally by dielectric isolation and vertically by junction isolation.

12. A method of isolating semiconductor devices comprising:

forming in a surface of a base semiconductor layer of a first conductivity type a well having a side wall and a bottom;
forming an insulative coating on said surface, said side wall and said bottom with an opening exposing at least a portion of said bottom and having a crystal direction to promote laterally divergent epitaxy; and
epitaxially growing a second semiconductor layer of an opposite conductivity type and the same crystalline structure as the base layer extending vertically and laterally from said opening onto said insulative coating on said side wall and any of said insulative coating on said bottom without growing polycrystalline thereon by preventing nucleation and growth of semiconductor material on the insulative coating.

13. A method according to claim 12 wherein said epitaxially growing is performed at a temperature and pressure to promote laterally divergent epitaxy over said insulative coating.

14. A method according to claim 12 wherein said epitaxially growing is performed using gases which produces selective epitaxial growth of monocystalline semiconductor layer over said insulative coating.

15. A method according to claim 12 wherein forming said insulative layer with an opening exposes substantially all of said bottom of said well.

16. A method according to claim 12 including implanting impurities of said second conductive type deep into said second layer after said epitaxially growing without intervening high temperature processing.

* * * * *